United States Patent
Koyama et al.

(10) Patent No.: US 7,728,394 B2
(45) Date of Patent: *Jun. 1, 2010

(54) SEMICONDUCTOR DEVICE AND MANUFACTURING METHOD THEREOF

(75) Inventors: Masato Koyama, Miura-gun (JP); Reika Ichihara, Yokohama (JP); Yoshinori Tsuchiya, Yokohama (JP); Yuuichi Kamimuta, Tsukuba (JP); Akira Nishiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/232,079

(22) Filed: Sep. 10, 2008

(65) Prior Publication Data
US 2009/0072331 A1      Mar. 19, 2009

Related U.S. Application Data

(63) Continuation of application No. 11/635,040, filed on Dec. 7, 2006, now Pat. No. 7,432,570.

(30) Foreign Application Priority Data

Dec. 9, 2005     (JP) .............................. 2005-356951

(51) Int. Cl.
  *H00L 29/79*     (2006.01)
(52) U.S. Cl. ....................... 257/412; 257/365; 257/369; 257/388; 257/E29.255
(58) Field of Classification Search ......... 257/365–369, 257/388, 407, 412, 627, 628; 438/198–199, 438/231
See application file for complete search history.

(56) References Cited

U.S. PATENT DOCUMENTS

| | | | |
|---|---|---|---|
| 5,873,955 | A | 2/1999 | Kirino et al. |
| 6,271,573 | B1 | 8/2001 | Suguro |
| 2006/0145201 | A1 | 7/2006 | Shiga |
| 2006/0197157 | A1 | 9/2006 | Koyama et al. |
| 2007/0048919 | A1 | 3/2007 | Adetutu et al. |
| 2007/0145488 | A1 | 6/2007 | Koyama et al. |
| 2008/0258230 | A1* | 10/2008 | Koyama et al. ............. 257/369 |

FOREIGN PATENT DOCUMENTS

WO    WO 2004009515 A1    1/2004

OTHER PUBLICATIONS

Schaeffer, J. K. et al., "Challenges for the Integration of Metal Gate Electrodes," IEEE, 2004 IEDM, pp. 287-290, (2004).

* cited by examiner

*Primary Examiner*—Dung A. Le
(74) *Attorney, Agent, or Firm*—Finnegan, Henderson, Farabow, Garrett & Dunner, L.L.P.

(57) ABSTRACT

A semiconductor device includes a substrate, a p-channel MIS transistor formed on an n-type well on the substrate, having a first gate dielectric and a first gate electrode formed thereon and formed of a Ta—C alloy wherein a crystal orientation ratio of a TaC (111) face in a film thickness direction [TaC (111) face/{TaC (111) face+TaC (200) face}] is 80% or more, and an n-channel MIS transistor formed on a p-type well on the substrate, having a second gate dielectric and a second gate electrode formed thereon and formed of a Ta—C alloy wherein a crystal orientation ratio of a TaC (111) face in a film thickness direction [TaC (111) face/{TaC (111) face+ TaC (200) face}] is 60% or less.

11 Claims, 19 Drawing Sheets

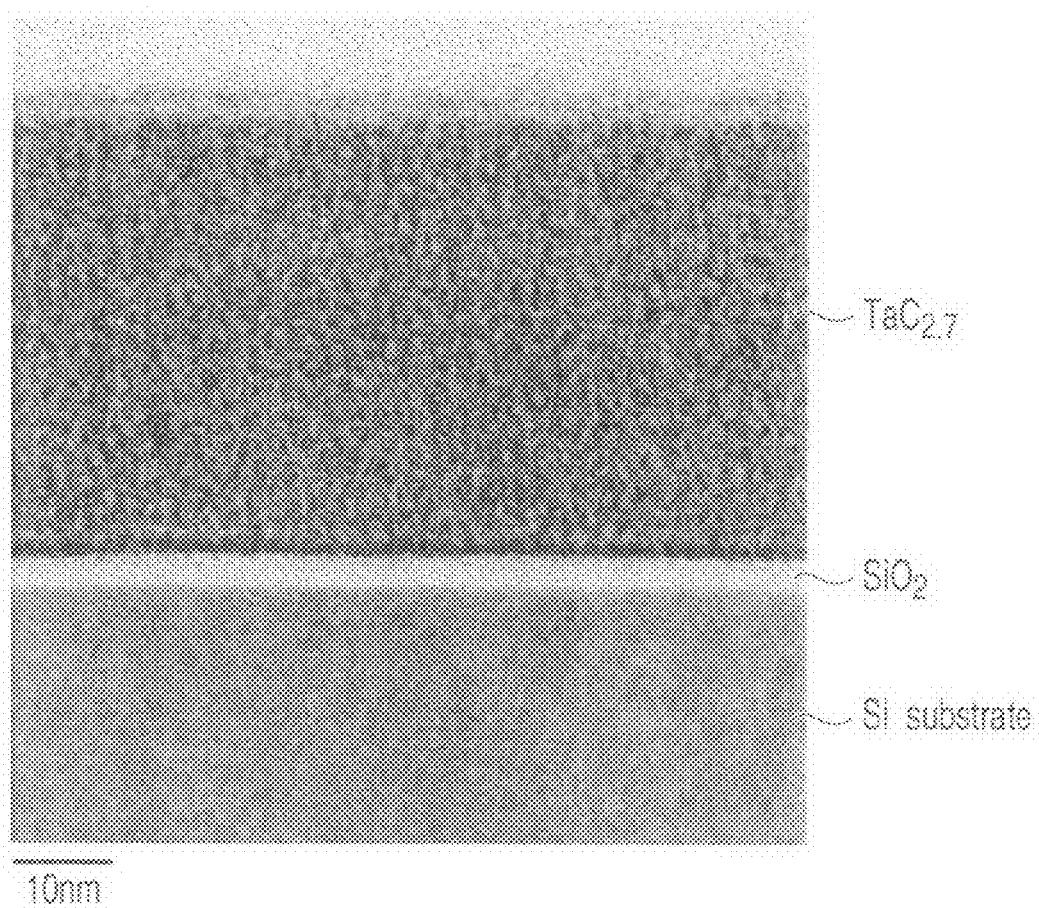
F I G. 15

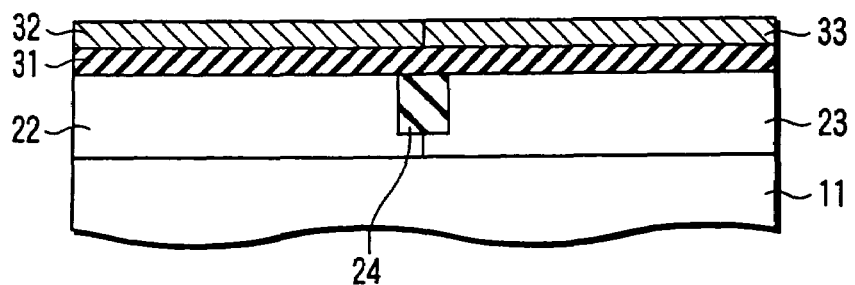
F I G. 18A
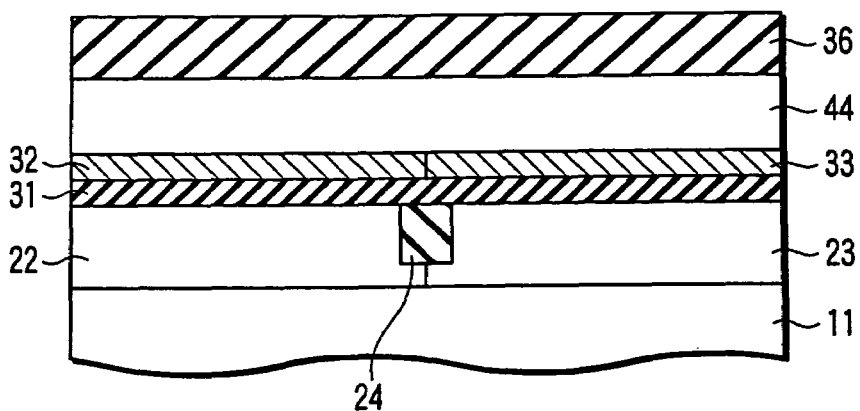
F I G. 18B
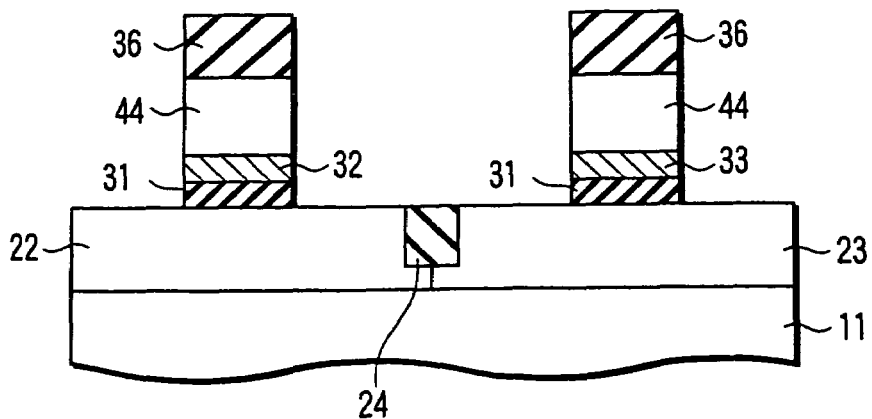
F I G. 18C

| Device | TaCx electrode | Work function | Modulation due to precipitated layer | Work function owing to TaCx orientation and precipitation |
|---|---|---|---|---|
| p-channel MISFET | TaC(111) preceded | =4.8eV | +0.2eV | 5.0eV |
| n-channel MISFET | TaC(200) preceded | =4.2eV | −0.2eV | 4.0eV |

SEMICONDUCTOR DEVICE AND MANUFACTURING METHOD THEREOF

CROSS-REFERENCE TO RELATED APPLICATIONS

This is a continuation of application Ser. No. 11/635,040, filed Dec. 7, 2006 now U.S. Pat. No. 7,432,570, the entire contents of which are incorporated herein by reference.

This application is based upon and claims the benefit of priority from prior Japanese Patent Application No. 2005-356951, filed Dec. 9, 2005, the entire contents of which are incorporated herein by reference.

BACKGROUND OF THE INVENTION

1. Field of the Invention

The present invention relates to a semiconductor device in which a p-channel MIS transistor and an n-channel MIS transistor are formed on the same substrate, and more particularly, it relates to a semiconductor device with an improved gate electrode structure and a manufacturing method thereof.

2. Description of the Related Art

Recently, in silicon complementary metal insulator semiconductor (CMIS) devices, an attempt has been made to use, as a gate electrode, a refractory metal such as titanium, molybdenum, tungsten or tantalum, or a nitride thereof. This is what is called a metal gate technique.

In the metal gate technique, depletion layers are not generated within the gate electrode in principle, and there is therefore no decrease caused in current drivability of a MIS transistor due to the depletion layers, in contrast with the case of a silicon gate. A TaCx metal gate technique is described in, for example, J. K. Schaeffer et al., "Challenges for the Integration of Metal Gate Electrodes", 2004 IEDM, p.p. 287 to 309). However, in this document, there is no report on physical property values other than the work function and specific resistance regarding TaCx physical properties.

Furthermore, there is a so-called dual metal gate technique in which a metal gate electrode having the same work function as that of n$^+$ silicon is disposed for an n-channel MIS transistor and a metal gate electrode having the same work function as that of p$^+$ silicon is disposed for a p-channel MIS transistor. In the dual metal gate technique, a threshold voltage can be controlled in the same manner as the conventional silicon gate technique, and it is possible to design a transistor having a low threshold voltage.

However, in the dual metal gate technique, since materials of the gate electrodes in the p-channel MIS transistor and the n-channel MIS transistor are different, film formation for these gate electrodes needs to be separately carried out, so that this technique has a large problem in that the gate electrodes have to be processed independently for the p-channel MIS transistor and the n-channel MIS transistor, in addition to problems such as increased film formation process steps and complication. This dual metal gate technique is most desirable in terms of transistor performance, but the above-mentioned problem of the complication of its manufacturing method has to be solved to achieve this technique.

As has been described, it is essential to replace the conventional silicon gate and introduce the metal gate technique in order to improve the current drivability of the transistor and realize a silicon CMIS device with a high processing speed. The dual metal gate technique is essential for enhanced performance because it can set a low threshold voltage of the transistor, but the complication of its manufacturing method has been the major obstacle to practical application.

It has therefore been desired to achieve a semiconductor device and a manufacturing method thereof capable of realizing a dual metal gate structure whose manufacturing method is easy and contributing to a characteristic improvement of the CMIS devices and the like.

BRIEF SUMMARY OF THE INVENTION

According to a first aspect of the invention, there is provided a semiconductor device, which includes:

a substrate;

a p-channel MIS transistor formed on an n-type well on the substrate, having a first gate dielectric film formed on the n-type well, and a first gate electrode formed on the first gate dielectric film, the first gate electrode formed of a Ta—C alloy in which a crystal orientation ratio of a TaC (111) face in a film thickness direction of the first lower layer gate electrode [TaC (111) face/{TaC (111) face+TaC (200) face}] is 80% or more; and an n-channel MIS transistor formed on a p-type well on the substrate, having a second gate dielectric film formed on the p-type well, and a second gate electrode formed on the second gate dielectric film, the second gate electrode formed of a Ta—C alloy in which a crystal orientation ratio of a TaC (111) face in a film thickness direction of the second lower layer gate electrode [TaC (111) face/{TaC (111) face+TaC (200) face}] is 60% or less.

According to a second aspect of the invention, there is provided a method of manufacturing a semiconductor device, which includes:

preparing a substrate having an n-type semiconductor area and a p-type semiconductor area insulated from each other;

forming gate dielectric films on the n-type semiconductor area and the p-type semiconductor area, respectively;

alternately supplying tantalum (Ta) and carbon (C) on the gate dielectric film on the n-type semiconductor area to form a first Ta—C alloy film in which a crystal orientation ratio of a TaC (111) face in a film thickness direction [TaC (111) face/{TaC (111) face+TaC (200) face}] is 80% or more;

simultaneously supplying tantalum (Ta) and carbon (C) onto the gate dielectric film on the p-type semiconductor area to form a second Ta—C alloy film in which a crystal orientation ratio of a TaC (111) face in a film thickness direction [TaC (111) face/{TaC (111) face+TaC (200) face}] is 60% or less; and processing the first TaC alloy film on the n-type semiconductor area and the second TaC alloy film on the p-type semiconductor area into gate electrode patterns.

BRIEF DESCRIPTION OF THE SEVERAL VIEWS OF THE DRAWING

FIG. 15 is a photomicrograph showing a sectional TEM image of a TaCx film in the case of C/Ta≅2.7;

FIGS. 18A to 18I are sectional views showing step by step a process of manufacturing the semiconductor device according to the fourth embodiment; and FIG. 19 is a diagram for explaining an improvement of the work function of the semiconductor device according to the fourth embodiment.

DETAILED DESCRIPTION OF THE INVENTION

Before describing embodiments, the outline and principle of the present invention will first be described.

Figure 1:
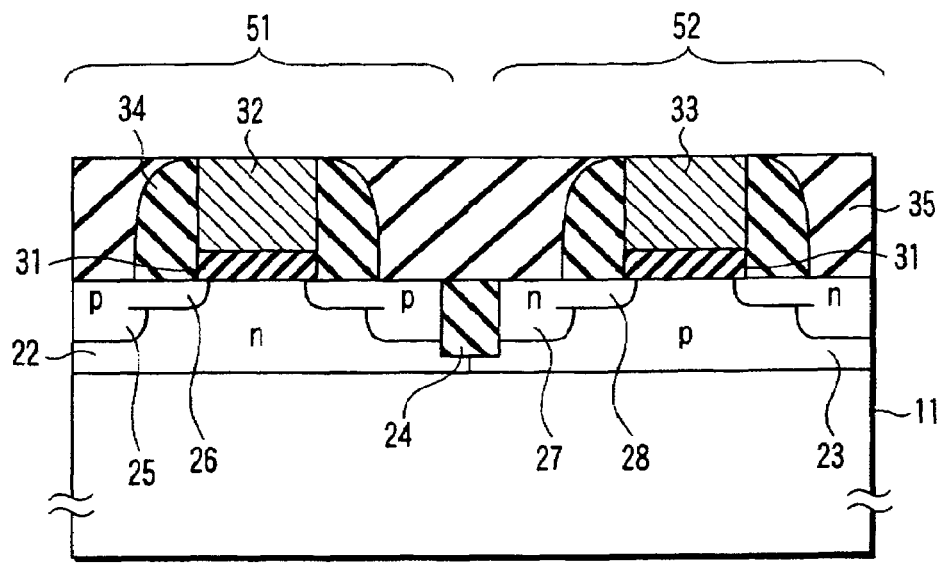
FIG. 1 is an elemental structure sectional view showing a schematic configuration of a semiconductor device according to a first embodiment.

One embodiment of the present invention concerns a semiconductor device comprising a CMIS device as shown in FIG. 1, and is mostly characterized by having crystallized TaCx as gate electrodes for both a p-channel MIS transistor and an n-channel MIS transistor, wherein TaCx of the p-channel MIS transistor has a strong (111) orientation, and (200) orientation components of the n-channel MIS transistor are increased to bring the work functions of the respective gate electrodes to those of $p^+$ silicon and $n^+$ silicon, thus achieving a dual metal gate by a single material TaCx.

It is to be noted that, in FIG. 1, the reference numeral 11 denotes an Si substrate, 22 denotes an n-type well, 23 denotes a p-type well, 24 denotes an isolation insulator, 25 denotes a p-type diffusion layer, 26 denotes a p-type extension layer, 27 denotes an n-type diffusion layer, 28 denotes an n-type extension layer, 31 denotes a gate dielectric film, 32 denotes a p-channel side TaCx gate electrode, 33 denotes an n-channel side TaCx gate electrode, 34 denotes a gate sidewall insulator, 35 denotes an interlayer insulator, 51 denotes a p-channel MIS transistor, and 52 denotes an n-channel MIS transistor.

On the other hand, a TaCx metal gate technique is described in the above-mentioned document. The difference between this prior art and the present invention is that while TaCx is used for both the p-channel MIS transistor and the n-channel MIS transistor in the present invention, a TaCx electrode is only used in the n-channel MIS transistor in the prior art. The prior art has such a limitation because the work function of the TaCx electrode is 4.18 eV. Even if TaCx of the prior art is used in the gate electrode of the p-channel MIS transistor, its threshold voltage becomes very high, and a normal operation of the CMIS is impossible. In addition, there is no report, in the above-mentioned document, on physical property values other than a work function and specific resistance regarding TaCx physical properties.

In the present embodiment, the composition ratio (C/Ta) between Ta and C is set at 0.5 to 1.5, and TaCx is used in a crystallized state. Further, the present inventors have newly found out that the (111) orientation can be intensified to obtain a work function of about 4.8 eV close to that of $p^+$ silicon and that the (200) orientation components can be increased in relation to the (111) orientation to obtain a work function close to that of $n^+$ silicon. This is applied to the dual metal gate of a CMIS transistor.

Figure 2:
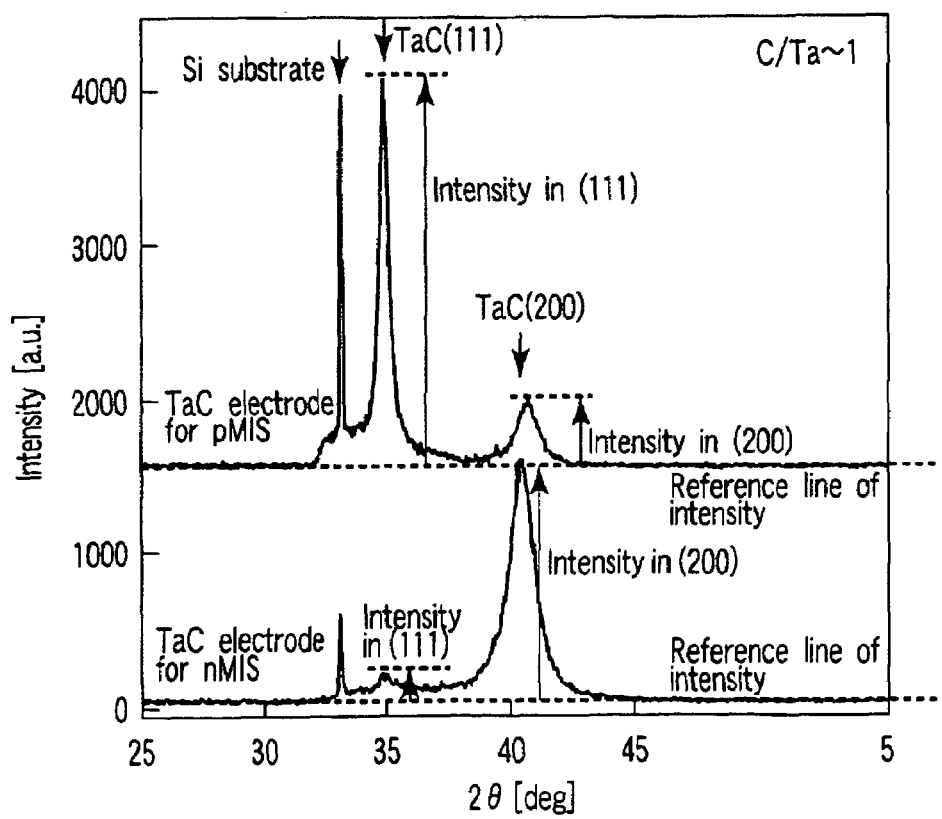
FIG. 2 is a characteristic chart showing a orientational change of a TaCx electrode due to a difference of film formation methods.

FIG. 2 shows experimental results of the examination of the crystallinity of a TaCx thin film having a thickness of 100 nm in the above discovery. The abscissa indicates an angle (2θ), and the ordinate indicates intensity. In addition, an offset is indicated in an ordinate direction so that characteristics of a TaC electrode for pMIS can be differentiated from characteristics of a TaC electrode for nMIS. The composition of TaCx films is C/Ta≅1, but it has been proved that the difference of film formation methods enables separate formation of a film having the strongest (111) diffraction peak and a film having the strongest (200) diffraction peak.

The result of using an analytical sample including a TaC film, a gate dielectric film and an Si substrate has been shown above. It should be understood that such an experiment can also be conducted with a completed transistor, in which case a part corresponding to a gate electrode of the transistor is cut out by a pickup method used in, for example, transmission electron microscopy (TEM), and the section of the gate electrode is analyzed by an electron diffraction method, such that it is possible to check the proportion of the (111) orientation to the (200) orientation. In this case, positioning accuracy regarding analyzing position is high because an electron beam of the TEM method is used. This makes it easy to check the orientation of the TaC film in an area contacting the gate dielectric film which is actually associated strongly with threshold voltage control.

Figure 3:
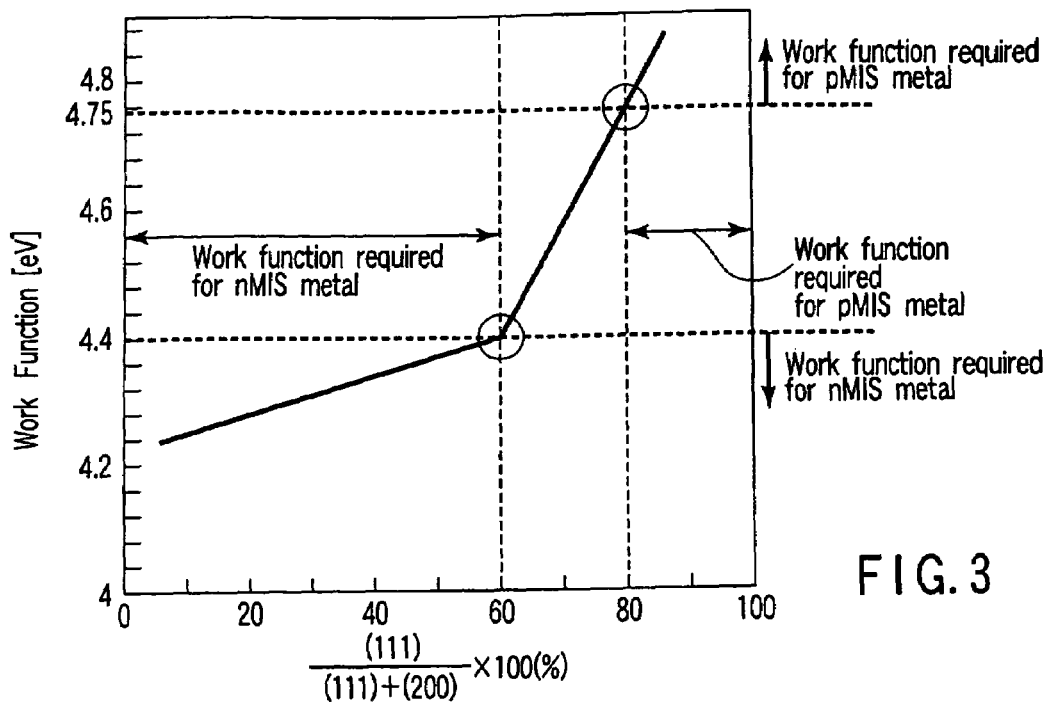
FIG. 3 is a characteristic chart showing a relation between the orientation and work function of a TaCx electrode.

FIG. 3 is a diagram showing a change of the work function when the orientation is changed as described above. It has been found out that a crystal orientation ratio α of the (111) face indicated by Equation (1) below needs to be 80% or more because TaCx shows a work function of 4.75 eV or more which is equal to that of $p^+$ silicon.

$$\alpha = TaC(111)face/\{TaC(111)face + TaC(200)face\} \times 100 \qquad (1)$$

Here, the (111) face crystal orientation ratio α is calculated from Equation (1) after obtaining absolute values of TaC (111) peak intensity and TaC (200) peak intensity in X-ray diffraction (XRD) spectra in FIG. 2. Here, peak areas may be used instead of the peak intensities. Moreover, when the (111) face crystal orientation ratio is obtained, a reference is set to a direction vertical to a surface of the gate electrode adjacent to the gate dielectric film, that is, a thickness direction of the gate film.

On the other hand, the present inventors have found out that the (111) crystal orientation ratio needs to be 60% or less because TaCx shows a work function of 4.4 eV or less which is equal to that of $n^+$ silicon.

It is to be noted that the (111) face crystal orientation ratio is more desirably 90% or more for the p-channel MIS transistor and 5% or less for the n-channel MIS transistor. Thus, it is possible to set 4.9 eV or more for the p-channel MIS transistor and 4.2 eV or less for the n-channel MIS transistor which are threshold voltages sufficiently low for a bulk-type CMIS device.

In addition, the (111) face crystal orientation ratio is calculated in FIG. 2 at 84% for the upper spectrum and 10% for the lower spectrum. The work functions of the TaC electrodes at this point are 4.80 eV and 4.25 eV, showing values which are sufficient to set a low threshold voltage of a bulk CMIS transistor.

Figure 4:
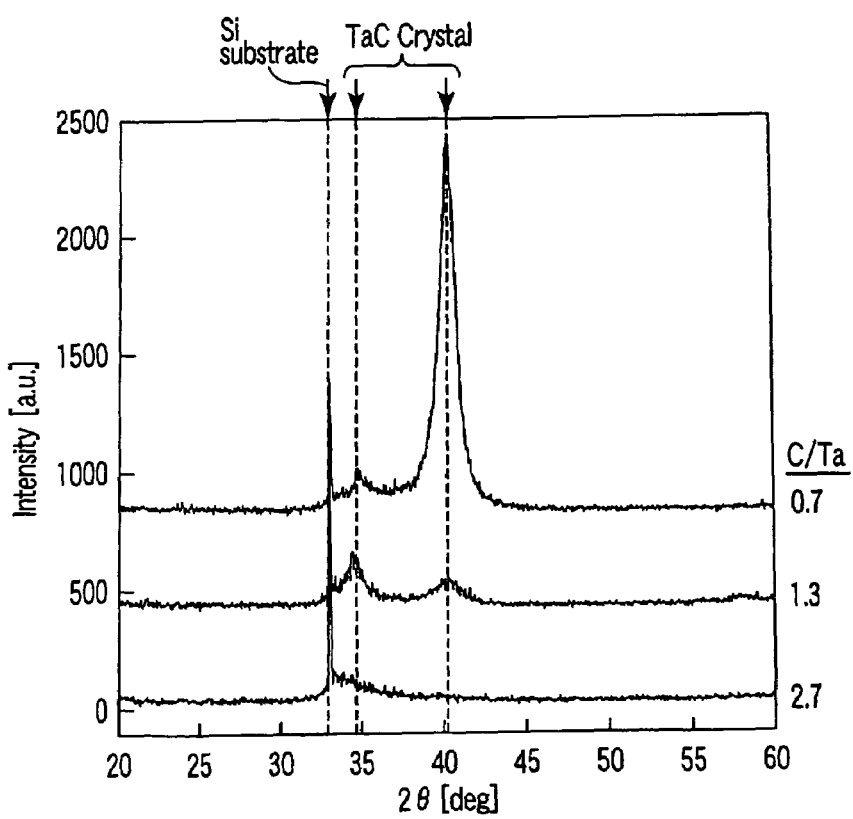
FIG. 4 is a characteristic chart showing a relation between the composition and crystallinity change of a TaCx electrode.

FIG. 4 concerns experimental results showing an orientational change in accordance with a change of the composition ratio (C/Ta) of TaCx. The same technique was used for the thin film formation in this experiment. The crystal diffraction intensity of a film weakens along with an increase of C/Ta, and no diffraction peak is obtained at a C/Ta of 2.7. It is premised that TaCx of the present invention is crystallized. An experiment in which the composition is more finely changed proves that C/Ta as a requisite for the crystallization of TaCx is 1.5 or less.

Figure 5A:
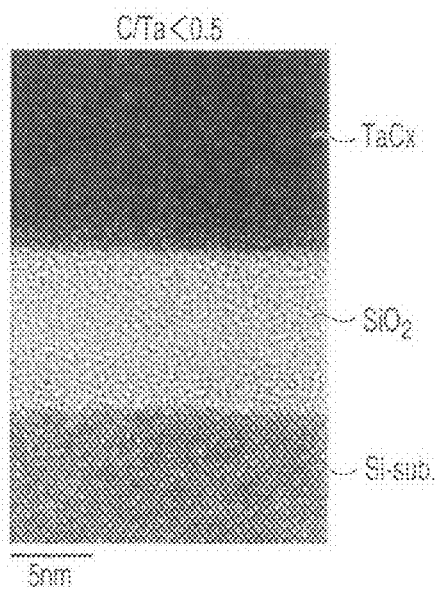
FIGS. 5A and 5B explain a change in heat resisting performance of a MIS structure in accordance with a change in composition ratio (C/Ta) of TaCx, and are photomicrographs showing sectional TEM images of the TaCx electrode.
Figure 5B:
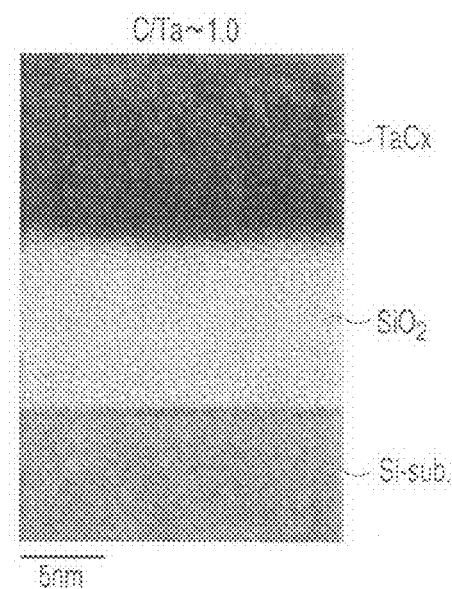

FIGS. 5A and 5B show sectional TEM photographs of a TaCx/SiO$_2$ structure observed after thermally treated at 1000° C. to decide a lower concentration limit of C/Ta. A TaCx/SiO$_2$ interface does not at all appear to be reacting in the case of C/Ta≅1.0 even after the thermal treatment at 1000° C. On the contrary, in the case of C/Ta<0.5, it has been found out that an interface reaction layer having a thickness of nearly 2 nm is produced in the TaCx/SiO$_2$ interface by the thermal treatment at 1000° C. The reaction layer precludes practical application because it causes performance deterioration such as work function modulation and electric trap formation.

Figure 6:
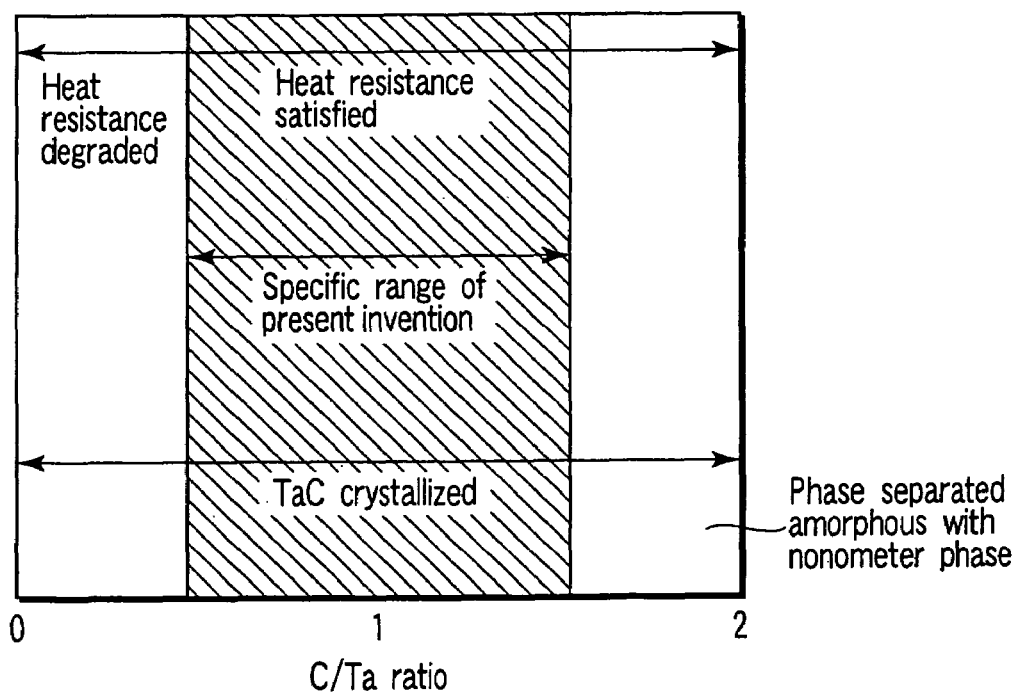
FIG. 6 is a schematic diagram showing grounds for the stipulation of a mixing ratio (C/Ta) between Ta and C.

Through the above preliminary experiment, compositional characteristics of dual metal gate TaCx of the present invention are stipulated as follows. First, C/Ta is 1.5 or less because the film has to be crystallized to obtain the function of a dual metal in crystal orientation control in the present invention. On the other hand, C/Ta has to be 0.5 or more from the viewpoint of maintaining properties of resisting a heat >1000° C. Thus, TaCx of the present invention is stipulated within a range of $0.5 \leq C/Ta \leq 1.5$. A limitation range of the C/Ta ratio in the present invention is schematically shown in FIG. 6.

Thus, as a result of examining the physical characteristics of the TaCx thin film in detail, the present inventors have found out that if the TaCx film is crystallized in a certain C/Ta composition ratio while its orientation is controlled, the TaCx work function can be modulated to be closer to that of n$^+$ silicon or p$^+$ silicon. The present invention has been carried out on the basis of this new discovery, and has a configuration and an advantage different from those in the category of prior arts.

The structure in the present invention has a great advantage that the processing of the gate electrodes can be collectively carried out because the gate electrodes of both the p-channel MIS transistor and the n-channel MIS transistor are TaCx. Thus, the number of process steps is remarkably reduced as compared with the case where another material is used as in the conventional dual metal gate, and moreover, the development of an etching process is reduced. This drastically advances the practicability of the dual metal gate.

The configuration whose outline has been described above makes it possible to provide, through an easy process, a semiconductor device comprising a high-performance metal gate CMIS device capable of setting a low threshold voltage and having no gate depletion.

In other words, the crystal orientation ratios of the TaC (111) faces of the gate electrodes of the p-channel and n-channel MIS transistors can be optimally set to achieve work functions suitable for the respective channels. In this case, the gate electrodes of the respective MIS transistors are based on the same material, such that a manufacturing process can be simplified.

Details of the present invention will hereinafter be described through the embodiments.

First Embodiment

As shown in FIG. 1, in a semiconductor device according to a first embodiment of the present invention, an n-type well area 22 and a p-type well area 23 are provided on an Si substrate 11. The n-type well area 22 is separated from the p-type well area 23 by an isolation insulator 24 having a shallow trench isolation (STI) structure. It is to be noted that a bulk substrate is used as the substrate in the present embodiment, but a silicon on insulator (SOI) substrate can also be used.

The n-type well area 22 is provided with a p-channel MIS transistor 51. The p-channel MIS transistor 51 comprises a p-type diffusion layer 25, a p-type extension layer 26, a gate dielectric film 31 and a TaCx gate electrode for pMIS 32. The gate dielectric film 31 is provided on the n-type well area 22, and the TaCx gate electrode for pMIS 32 is provided on the gate dielectric film 31. It is to be noted that in the present embodiment, sidewalls 34 made of an insulating material such as a silicon nitride film or a silicon oxide film are provided on both sides of a stacked structure of the gate dielectric film 31 and the TaCx gate electrode for pMIS 32.

Furthermore, the p-type extension layers 26 are provided in the n-type well areas 22 on both sides of the stacked structure of the gate dielectric film 31 and the TaCx gate electrode for pMIS 32, and the p-type diffusion layers 25 are provided in the n-type well area 22 on opposite sides of the sidewalls 34. The p-type diffusion layer 25 is configured so that it is bonded to the n-type well area 22 more deeply than the p-type extension layer 26. Moreover, the p-type diffusion layer 25 and the p-type extension layer 26 serve as source/drain areas of the p-channel MIS transistor 51.

On the other hand, an n-channel MIS transistor 52 is provided in the p-type well area 23. The n-channel MIS transistor 52 comprises an n-type diffusion layer 27, an n-type extension layer 28, a gate dielectric film 31 and a TaCx gate electrode for nMIS 33. The gate dielectric film 31 is provided on the p-type well area 23, and the TaCx gate electrode for nMIS 33 is provided on the gate dielectric film 31. It is to be noted that in the present embodiment, sidewalls 34 made of an insulating material are provided on both sides of a stacked structure of the gate dielectric film 31 and the TaCx gate electrode for nMIS 33.

Furthermore, the n-type extension layers 28 are provided in the p-type well area 23 on both sides of the stacked structure of the gate dielectric film 31 and the TaCx gate electrode for nMIS 33, and the n-type diffusion layer 27 is provided in the p-type well area 23 on opposite sides of the sidewalls 34. The n-type diffusion layer 27 is configured so that it is bonded to the p-type well area 23 more deeply than the n-type extension layer 28. Moreover, the n-type diffusion layer 27 and the n-type extension layer 28 serve as source/drain areas of the n-channel MIS transistor 52.

Next, a method of manufacturing the semiconductor device of the present embodiment will be described referring to FIGS. 7A to 7L.

Figure 7A:
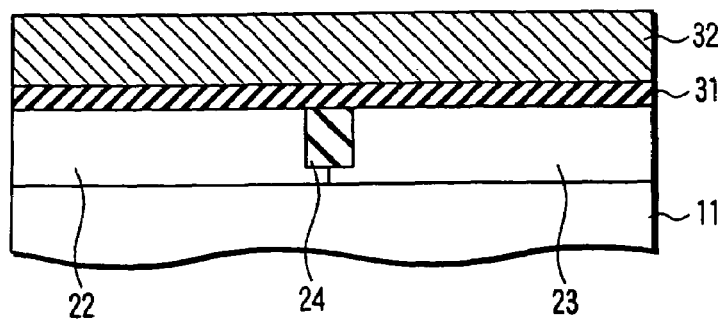
FIGS. 7A to 7L are sectional views showing step by step a process of manufacturing the semiconductor device according to the first embodiment.

First, as shown in FIG. 7A, the n-type well area 22 and the p-type well area 23 which are separated by the isolation insulator 24 are formed on the Si substrate 11. Subsequently, the gate dielectric film 31 and the TaCx electrode for pMIS 32 are deposited over the entire surface on a wafer.

The high dielectric film that can be used includes, for example, an oxide or mixed oxide of rare-earth elements such as Ti, Hf, Zr and La, silicate or aluminate of rare-earth elements such as Ti, Hf, Zr and La or a dielectric film in which nitrogen is added to the above materials, $Si_3N_4$, $Al_2O_3$, $Ta_2O_5$, $TiO_2$, $La_2O_3$, $CeO_2$, $ZrO_2$, $HfO_2$, $SrTiO_3$, $Pr_2O_3$ or a dielectric film in which nitrogen is added to the above materials. Here, SiON having a thickness of 1.5 nm is deposited by thermal oxidation and plasma nitridation by way of example. To form the high-K gate dielectric film, it is possible to use a metal organic chemical vapor deposition (MOCVD) method, an atomic layer deposition (ALD) method, a molecular beam epitaxy (MBE) method, a physical vapor deposition (PVD) method or the like.

The TaCx electrode for pMIS 32 is formed by sputtering under Ar atmosphere using a TaC compound target in which the composition ratio (C/Ta) between Ta and C is adjusted to a range of 0.5 to 1.5. The composition ratio (C/Ta) in the present embodiment is 1.0, and the film thickness is 100 nm. Further, this method can be implemented when the flow of Ar ranges from 1 to 20 sccm, a voltage applied to the TaC target is 50 to 500 W, and the degree of vacuum within the device during the sputtering ranges from 0.01 to 0.4 Pa. Thus, it is possible to form the TaC electrode 32 in which a (111) face crystal orientation ratio is 80% or more. The TaC layer formed in the above method has stress within the film thereof, and this stress serves as driving force for preferential orientation on a (111) face.

Figure 8A:
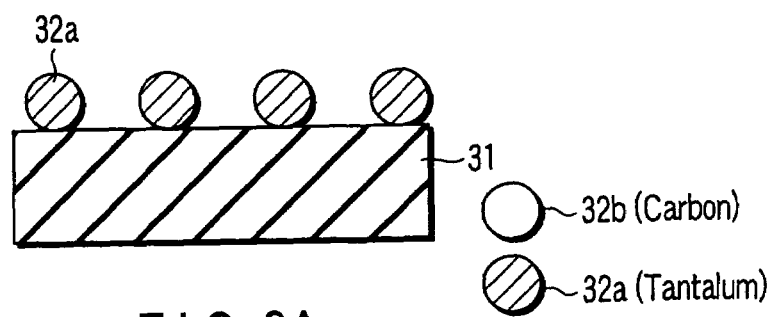
FIGS. 8A to 8C are schematic diagrams for explaining a method of forming a TaCx electrode for pMIS.
Figure 8B:
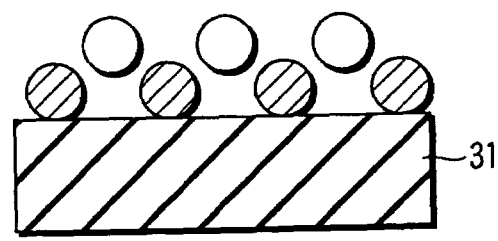
Figure 8C:
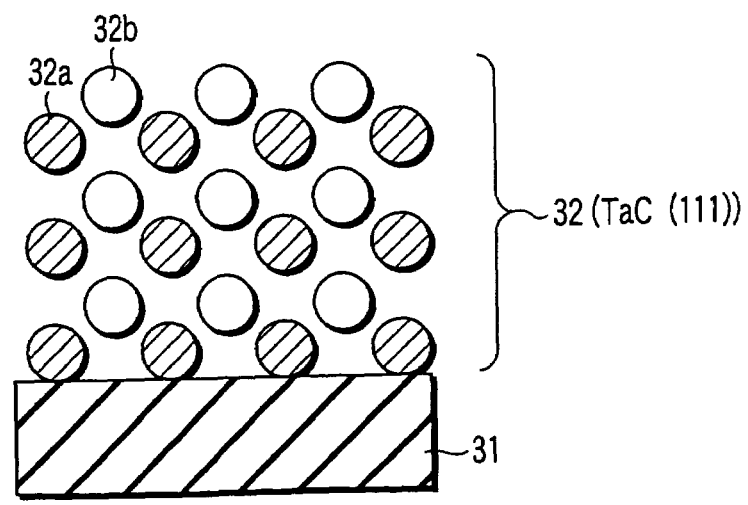

Furthermore, it is advantageous that Ta layers and C layers are alternately present in a film thickness direction in order to efficiently form the TaC electrode for pMIS 32 in which the (111) face crystal orientation ratio is 80% or more. The principle of this film formation method is schematically shown in FIGS. 8A to 8C. TaC assumes a cubic crystal structure, and its (111) face has a structure in which the Ta layers and the C layers are alternately stacked. Therefore, an atomic arrangement similar to that on the (111) face is intentionally formed at the stage of film formation, such that it is possible to more efficiently obtain a TaC thin film oriented on the (111) face.

Such a manufacturing method can be achieved by a technique similar to the atomic layer deposition (ALD). That is, the supply of Ta source and the supply of C source can be alternately carried out layer by layer as shown in FIGS. 8A to 8C. That is, tantalum 32a is deposited for one atomic layer (FIG. 8A), and carbon 32b is deposited thereon for one atomic layer (FIG. 8B), and then tantalum 32a is deposited thereon for one atomic layer (FIG. 8C). Here, it is possible to use, as the Ta source, a material with relatively high vapor pressure, such as a chloride base, amide base or imide base material. As the C source, it is possible to use, for example, acetylene, $CH_4$, $C_2H_4$, $CCl_4$, or CO.

Furthermore, a sputtering method can also be used to achieve the manufacturing method described above. In this case, a multi-cathode sputtering apparatus having a plurality of cathodes is used, to which a Ta target and a C target are attached. Sputtering for one layer of the Ta target and sputtering for one layer of the C target can be alternately carried out to form a TaC thin film for pMIS.

Here, the order of forming films on the gate dielectric film does not greatly influence the orientation on the (111) face, regardless of whether the film formation is started with C or Ta. However, when the film formation is started with C on the gate dielectric film, C is present on the gate dielectric film without being bonded to Ta, resulting in a situation where carbon is more likely to move into the gate dielectric film at this film formation stage. It is known that C within the gate dielectric film originates a fixed charge and cause device characteristics to deteriorate. Therefore, in the present embodiment, the Ta layer is first deposited.

Furthermore, if the surface of the TaCx electrode for pMIS 32 is oxidized at a significantly small thickness after this step, the process resistance of the TaCx electrode in subsequent steps is improved. Here, spike annealing at 1000° C. is carried out under 1% oxygen atmosphere to form an oxide layer having a thickness of 1 nm or less on the TaCx surface.

Next, an SiN layer 36 is deposited all over the surface of the structure in FIG. 7A, and the top of the n-type well area 22 is only covered with the SiN layer 36 using a conventional lithographic technique and etching technique. Using this SiN layer 36 as a mask, the TaCx electrode for pMIS 32 on the p-type well area 23 is removed by an ordinary etching gas. Thus, the structure in FIG. 7B is obtained.

Figure 7B:
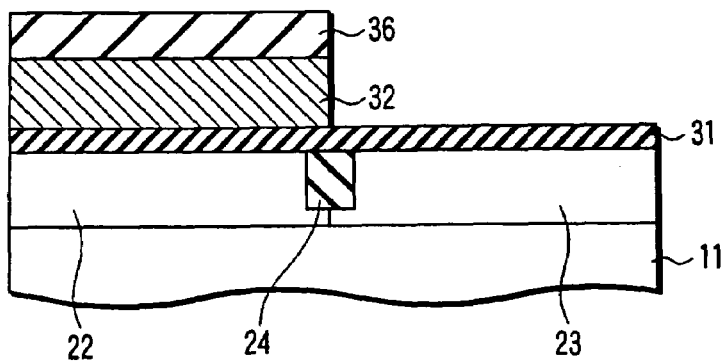
Figure 7C:
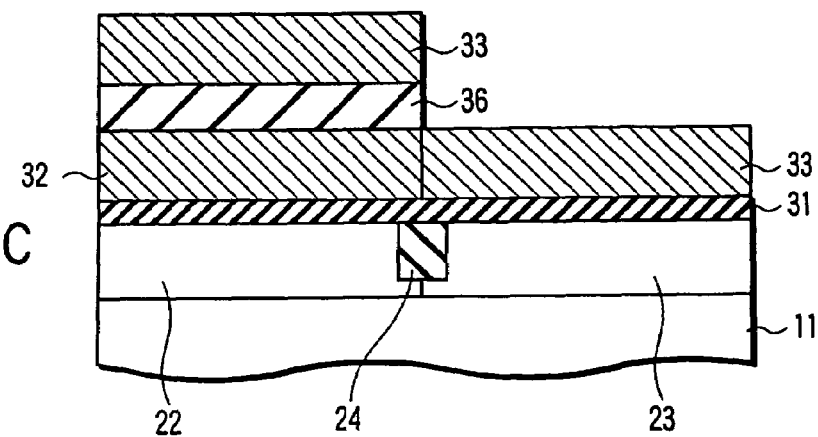
Figure 9A:
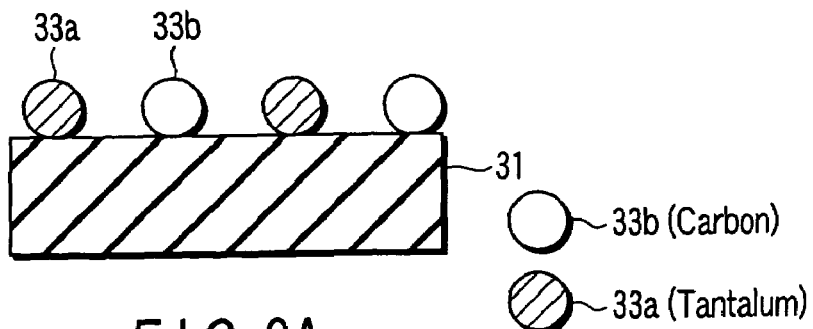
FIGS. 9A to 9C are schematic diagrams for explaining a method of forming a TaCx electrode for nMIS.
Figure 9B:
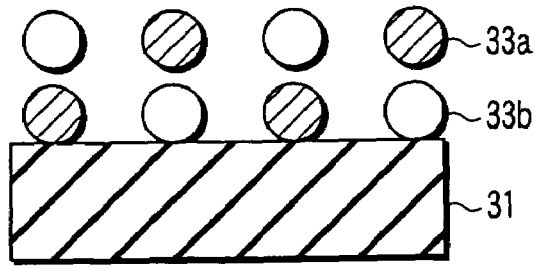
Figure 9C:
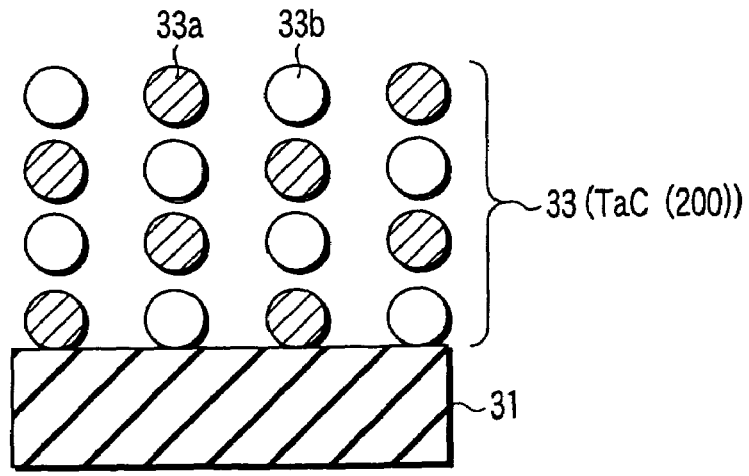

Next, the TaCx electrode for nMIS 33 is deposited all over the surface of the structure in FIG. 7B, and the structure in FIG. 7C is obtained. In order to form the TaCx electrode for nMIS 33 in which the (111) face crystal orientation ratio is 60% or less, it is important that a film is formed so that the Ta atomic layers and the C atomic layers are not alternately present in the film thickness direction, in contrast to the formation of the TaCx electrode for pMIS 32 previously described. Schematic diagrams for the principle of this film formation are shown in FIGS. 9A to 9C.

In order to form the TaCx electrode for nMIS 33 by a CVD method, it is important that the Ta source and the C source are simultaneously supplied. That is, tantalum atoms 33a and carbon atoms 33b are deposited in parallel on the dielectric film 31 (FIG. 9A), and the carbon atoms 33b are deposited on the tantalum atoms 33a and the tantalum atoms 33a are deposited on the carbon atoms 33b (FIG. 9B), and this is repeated in the similar manner (FIG. 9C). Thus, the formation of TaC is implemented so that Ta and C coexist in one layer, and therefore, the (111) face is not easily formed, or rather, the (200) face is easily formed. Here, the Ta source and the C source may be identical with those used for the formation of the TaCx electrode for pMIS 32.

When the sputtering method is used, it is desirable to use simultaneous sputtering of the Ta target and the C target. In this case, Ta and C are simultaneously sputtered, such that the (111) face is not easily formed and the (200) face is easily formed, in contrast to the method of forming the TaCx electrode for pMIS 32. In the present embodiment, a TaCx film with C/Ta=1.0 is deposited at 100 nm by the simultaneous sputtering of the two targets including Ta and C. Techniques such as the CVD method or MBE method may be used for the deposition of this film.

Furthermore, if the surface of the TaCx electrode for nMIS 33 is treated after this step so that it is oxidized at a significantly small thickness, the process resistance of the TaCx electrode in subsequent steps is improved. Here, spike annealing at 1000° C. is carried out under 1% oxygen atmosphere to form an oxide layer having a thickness of 1 nm or less on the TaCx surface.

Figure 7D:
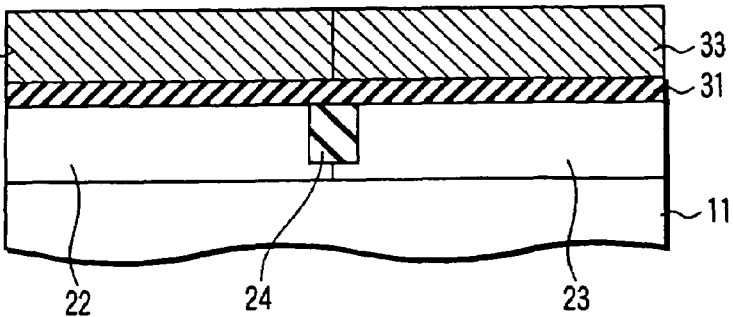

Next, as shown in FIG. 7D, the SiN film 36 is removed to remove the TaCx electrode for nMIS 33 on the top of the n-type well area 22 by lift off. Specifically, SiN can be dissolved by, for example, a hot phosphoric acid process. In this case, since TaCx does not dissolve into a hot phosphoric acid solution regardless of its orientation, the structure in FIG. 7D can be obtained.

Figure 7E:
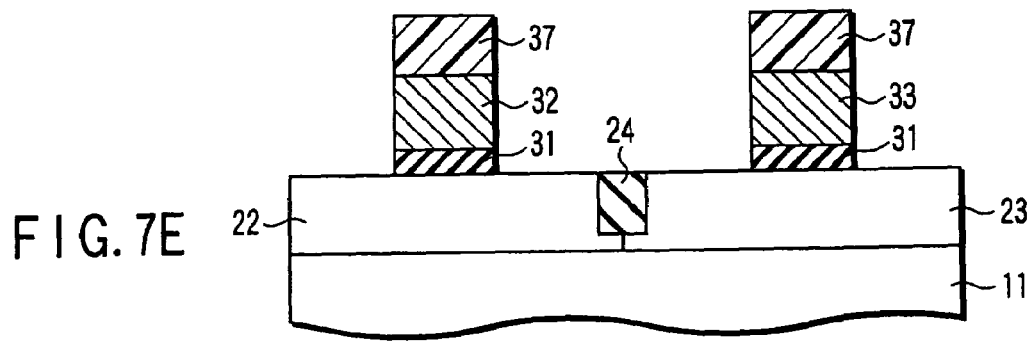

Next, as shown in FIG. 7E, a gate electrode resist pattern 37 is formed using a conventional lithographic technique and etching technique, and the TaCx electrodes 32 and 33 and the gate dielectric film 31 are processed by use of an ordinary etching gas such as a chlorine-based or bromine-based etching gas. In this process, the TaCx electrode for pMIS 32 and the TaCx electrode for nMIS 33 are different in orientation but the same in composition, and their etching rates are much the same, so that the collective processing of the two transistors is possible.

Figure 7F:
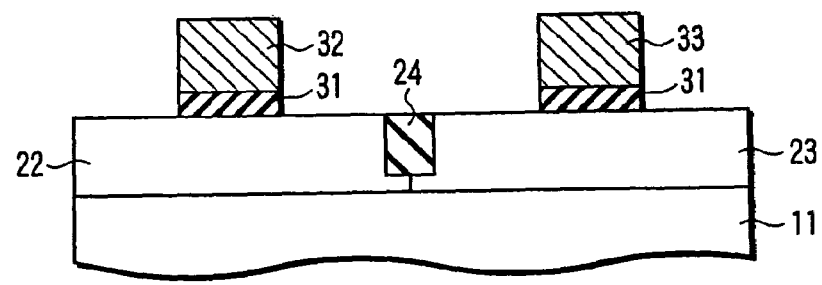

Next, as shown in FIG. 7F, the resist pattern 37 is removed by an $O_2$ asher treatment. At this point, the side surfaces of the TaCx electrode for pMIS 32 and the TaCx electrode for nMIS 33 are slightly oxidized. Subsequently, the resist, residuals and the like which have not been completely removed by the $O_2$ asher are chemically removed by a mixture of sulfuric acid and a hydrogen peroxide solution. At this point, the TaCx electrode for pMIS 32 and the TaCx electrode for nMIS 33 essentially have strong chemical resistance, but in addition to this, have their surfaces (both upper surfaces and side surfaces) covered with thin oxides, so that they are not easily eroded by the mixture of sulfuric acid and the hydrogen peroxide solution.

Figure 7G:
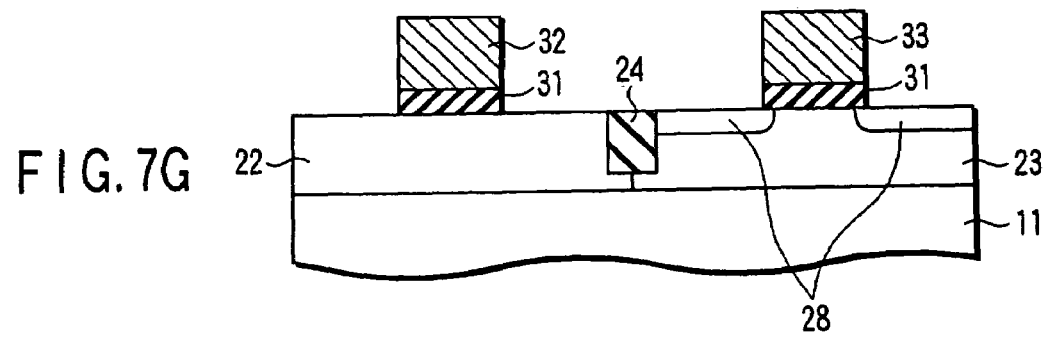

Next, as shown in FIG. 7G, the top of the n-type well area 22 is protected by a resist (not shown), and n-type impurities such as phosphorus, arsenic and antimony are ion-implanted into the p-type well area 23. Further, the resist on the n-type well area 22 is removed, and then the n-type extension layer 28 is formed by the spike annealing at 1000° C. or more.

Figure 7H:
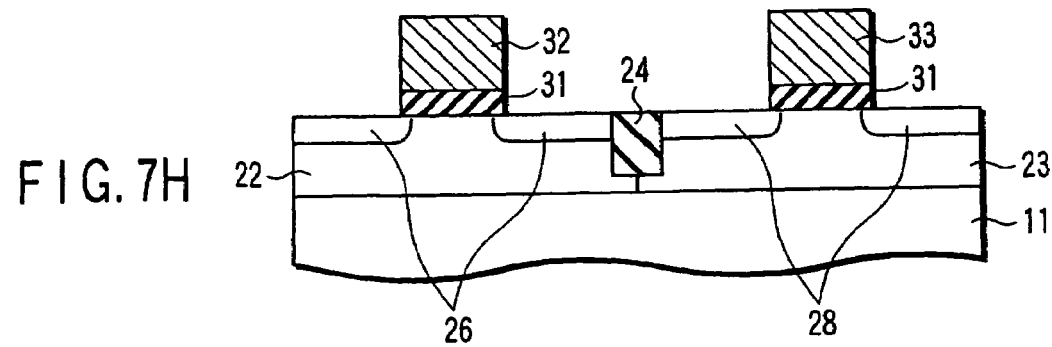

Next, as shown in FIG. 7H, the top of the p-type well area 23 is protected by a resist (not shown), and p-type impurities such as boron and indium are ion-implanted into the n-type well area 22. The resist on the p-type well area 23 is removed, and then the p-type extension layer 26 is formed by the spike annealing at 1000° C. or more.

Figure 7I:
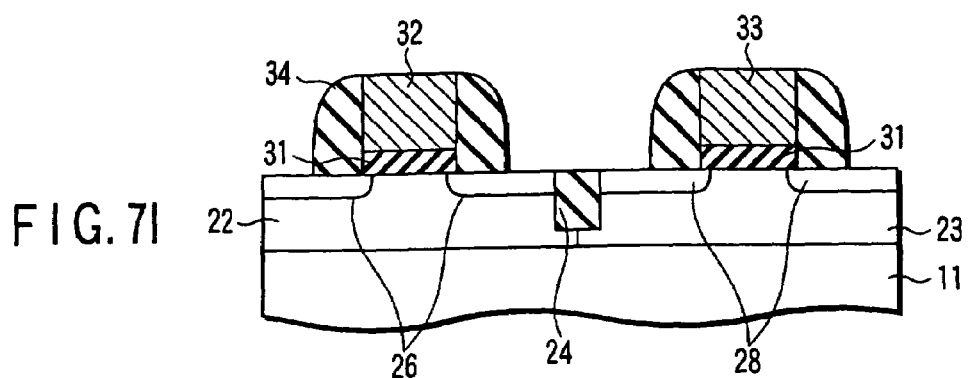

Next, as shown in FIG. 7I, the gate sidewall insulator 34 is formed in a conventional process. That is, an oxide film or the like is deposited over the entire surface on the substrate by the CVD method or the like, and then etched back by RIE or the like until the upper surfaces of the TaCx electrodes 32 and 33 are exposed.

Figure 7J:
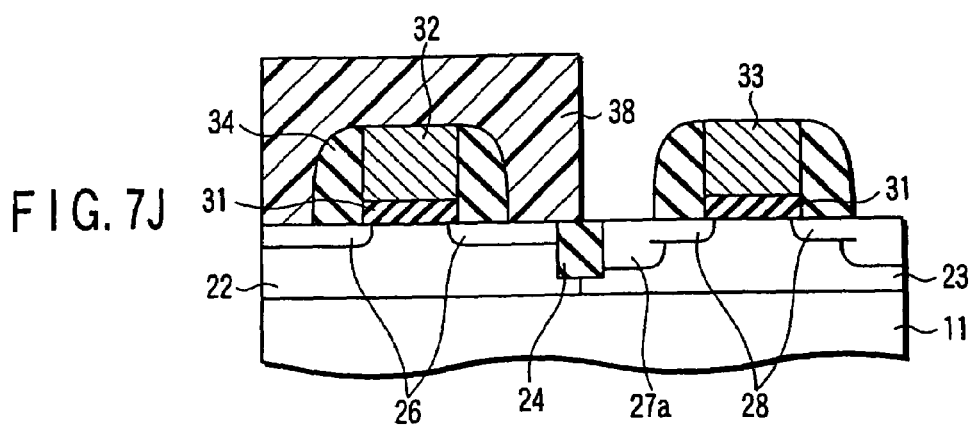

Next, as shown in FIG. 7J, the top of the n-type well area 22 is protected by a resist 38, and n-type impurities such as phosphorus, arsenic and antimony are ion-implanted into the p-type well area 23, thus forming an n-type implantation area 27a.

Figure 7K:
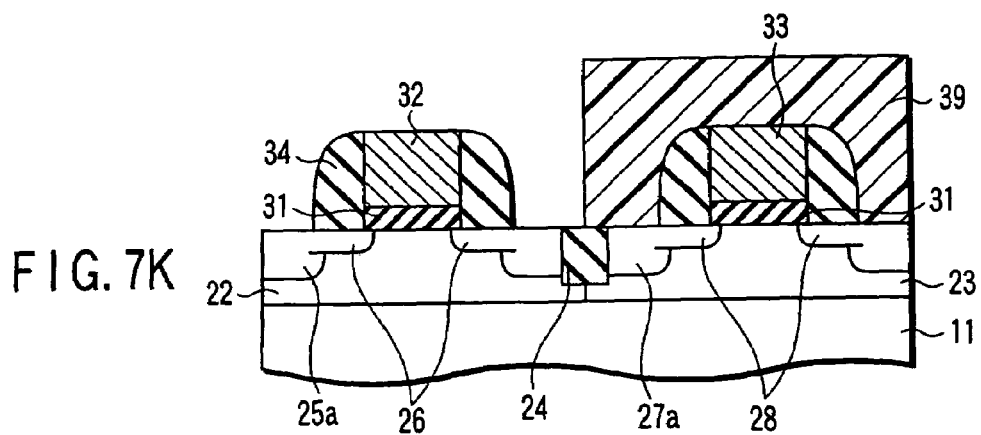

Next, as shown in FIG. 7K, the resist 38 on the n-type well area 22 is removed, and the top of the p-type well area 23 is protected by a resist 39, and then p-type impurities such as boron and indium are ion-implanted into the n-type well area 22, thus forming a p-type implantation area 25a.

Figure 7L:
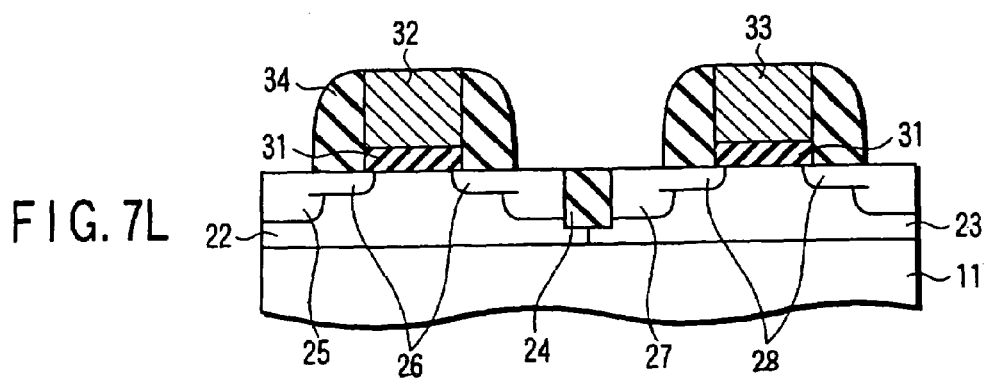

Next, as shown in FIG. 7L, the resist 39 on the p-type well area 23 is removed, and a heat treatment at 900° C. or more is then carried out to completely activate the n-type diffusion layer 27 and the p-type diffusion layer 25. Subsequently, after the formation of the interlayer insulator 35 and conventional steps such as planarization, the above-mentioned structure shown in FIG. 1 can be obtained.

On the other hand, in the experiment using the XRD previously described, average information on the orientation of the TaCx film is only known, so that when a distribution of the orientation is present in the film thickness direction, there is a possibility that the average orientation of the film is different from the orientation in the vicinity of the gate dielectric film. Since the work function of the MIS structure is decided by the TaCx orientation in the vicinity of the interface of the gate dielectric film, it is necessary to check this distribution in the depth direction.

Figure 10A:
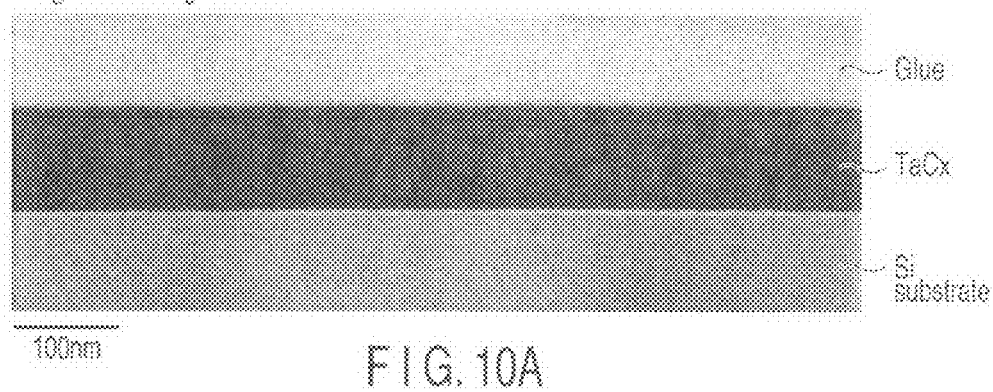
FIGS. 10A and 10B are photomicrographs showing sectional TEM images of a structure composed of the TaCx electrode for nMIS, $SiO_2$ and Si at the completion of the device in the first embodiment.
Figure 10B:
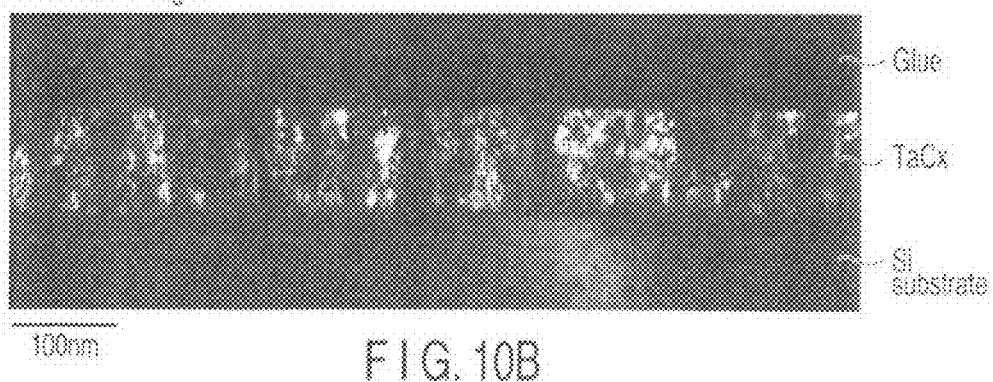

FIGS. 10A and 10B are TEM photographs showing the section of a structure composed of the TaCx electrode for nMIS 33 (with a large number of (200) orientation components), $SiO_2$ and Si-MIS at the completion of the device in the present embodiment. FIG. 10A shows a normal bright-field TEM image, and FIG. 10B concerns an experimental result of a dark-field TEM image for checking the continuity of crystal grains within the TaCx electrode. In the dark-field image, white parts indicate TaC crystal grains oriented in a particular direction.

It has been found from the result of dark-field observation in FIG. 10B that continuous single TaC grains are formed in the film thickness direction. That is, in this embodiment, the proportion of the (200) orientation is higher in parts of the TaCx film having a thickness of 100 nm contacting the gate dielectric film, and it has been confirmed that this leads to a low work function.

As described above, according to the present embodiment, both the gate electrode 32 of the p-channel MIS transistor 51 and the gate electrode 33 of the n-channel MIS transistor 52 are formed of a Ta—C alloy, and the crystal orientation ratios of TaC in the gate electrodes 32 and 33 are optimally set, such that low threshold voltages of the respective transistors can be set, and it is possible to obtain a CMIS device having the gate electrodes with low resistance and heat resisting properties and without the problem of depletion. Moreover, the gate electrodes of the respective MIS transistors are based on the same material, such that it is possible to prevent an increase in the number of steps in the manufacture of this CMIS device, and no complicated process is required.

Second Embodiment

Figure 11:
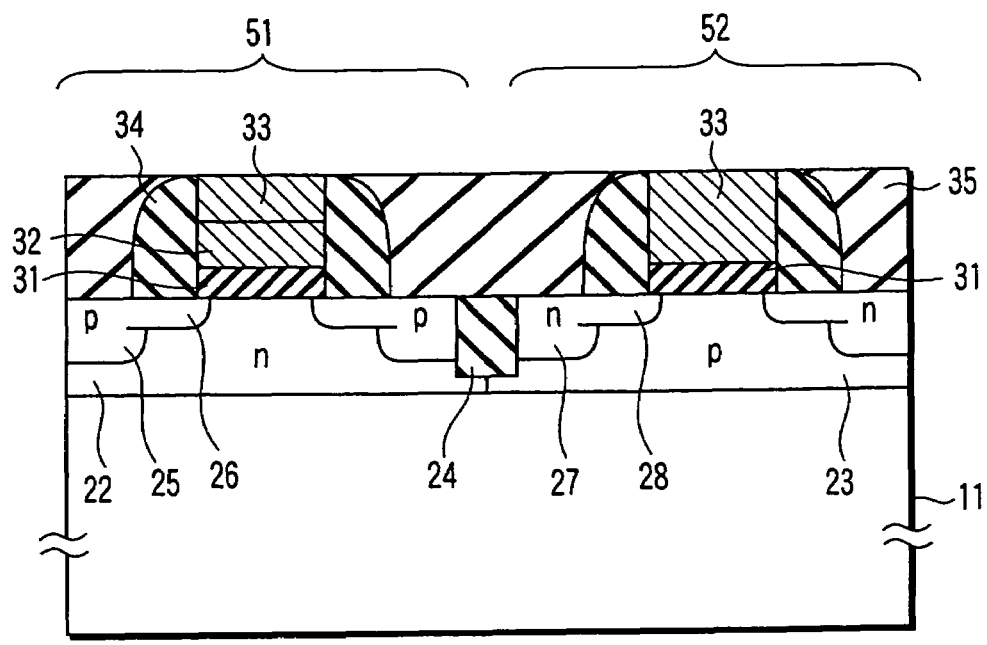
FIG. 11 is an elemental structure sectional view showing a schematic structure of a semiconductor device according to a second embodiment.

A schematic configuration of a semiconductor device according to a second embodiment of the present invention is shown in FIG. 11, in which the same signs are assigned to the same parts as those in FIG. 1 and these parts are not described in detail.

A CMIS device of the present embodiment has a structure in which a TaCx electrode for nMIS 33 is disposed on the top of a TaCx electrode for pMIS 32 of a p-channel MIS transistor 51 in the structure of the first embodiment. This structure has been devised to simplify the process of forming the TaCx electrode.

Figure 12A:
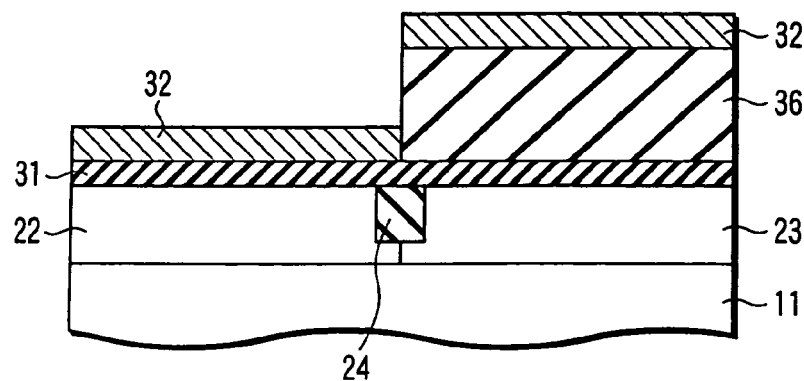
FIGS. 12A to 12D are sectional views showing step by step a process of manufacturing the semiconductor device according to the second embodiment.

A method of manufacturing the semiconductor device of the present embodiment will be described referring to FIGS. 12A to 12D. First, as shown in FIG. 12A, an n-type well area 22 and a p-type well area 23 which are separated by an isolation insulator 24 are formed on an Si substrate 11. Subsequently, a gate dielectric material film 31 is deposited over the entire surface on a wafer.

The high dielectric film that can be used includes, for example, an oxide or mixed oxide of rare-earth elements such as Ti, Hf, Zr and La, silicate or aluminate of rare-earth elements such as Ti, Hf, Zr and La or a dielectric film in which nitrogen is added to the above materials, $Si_3N_4$, $Al_2O_3$, $Ta_2O_5$, $TiO_2$, $La_2O_3$, $CeO_2$, $ZrO_2$, $HfO_2$, $SrTiO_3$, $Pr_2O_3$ or a dielectric film in which nitrogen is added to the above materials.

Here, HfSiON having a thickness of 3 nm (a ratio of 0.5 or less of Hf/Hf+Si, nitrogen concentration: 20-atomic percent) is deposited in accordance with an MOCVD method by way of example. Methods of deposition that can be used include an ALD method, an MBE method, a PVD method and the like.

Subsequently, an SiN layer 36 is deposited on the gate dielectric film 31 using a conventional process, and the SiN film 36 on the n-type well area 22 is only removed using a conventional lithographic technique and wet etching technique. Then, the TaCx electrode for pMIS 32 is deposited over the entire surface on the wafer, thus obtaining the structure in FIG. 12A. Here, the thickness of the TaCx electrode needs to be 1.5 nm or more. In the present embodiment, the thickness of the TaCx electrode is 5 nm.

Figure 12B:
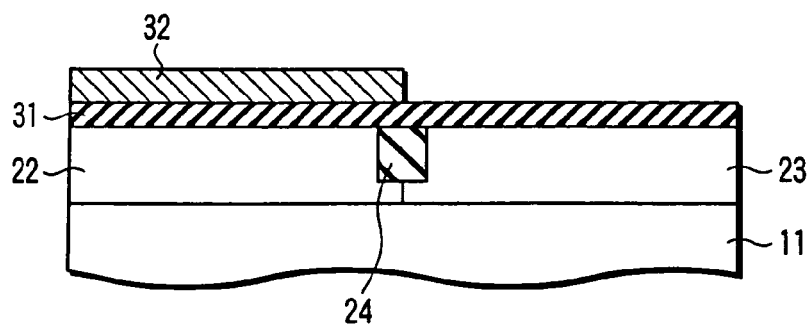

Next, as shown in FIG. 12B, the SiN layer 36 is removed by, for example, hot phosphoric acid etching to remove the TaCx electrode for pMIS 32 formed thereon by lift off. In contrast to the first embodiment, the lift off method is used instead of dry etching for the removal of TaCx. This can avoid problems such as the introduction of damages into the gate dielectric film due to the dry etching, and a reduction in the thickness (over etching) of the gate dielectric film 31 on the top of the p-type well area 23 due to the fact that a limited selection ratio can only be obtained.

Figure 12C:
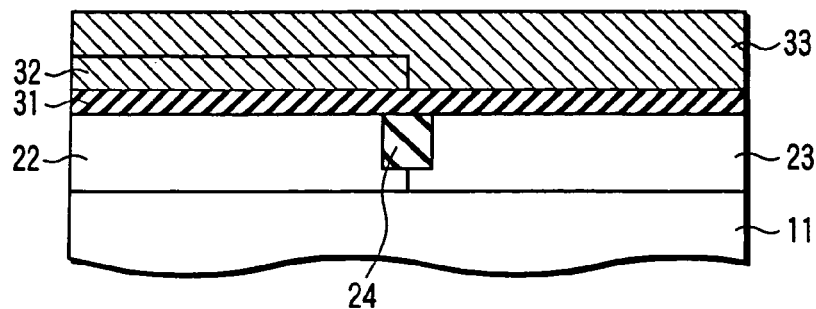
Figure 12D:
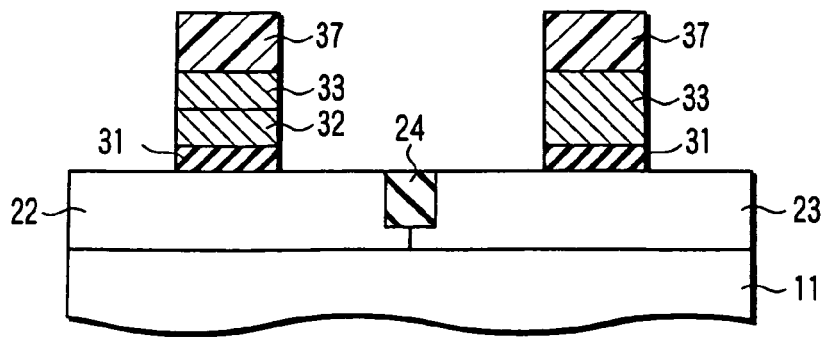

Next, as shown in FIG. 12C, the TaCx electrode for nMIS 33 is deposited over the entire surface on the wafer. Then, as shown in FIG. 12D, after a gate electrode resist pattern 37 is formed using a conventional lithographic technique and etching technique, the TaCx electrodes 32 and 33 and the gate dielectric film 31 are processed by use of an ordinary etching gas. In this process, the TaCx electrode for pMIS 32 and the TaCx electrode for nMIS 33 are different in orientation but the same in composition, and their etching rates are almost the same, so that the collective processing of the two transistors is possible.

Subsequently, after the removal of the resist and the formation of an n-type extension layer 28, a p-type extension layer 26, a gate sidewall insulator 34, an n-type diffusion layer 27, a p-type diffusion layer 25 and an interlayer insulator 35, the structure in FIG. 11 is completed.

With such a configuration, it is possible to obtain an advantage similar to that in the previous first embodiment, and it is also possible to reduce the damage of etching to the gate dielectric film 31 and to avoid the thickness reduction of the gate dielectric film, such that a CMIS device with higher performance can be achieved.

Third Embodiment

Figure 13:
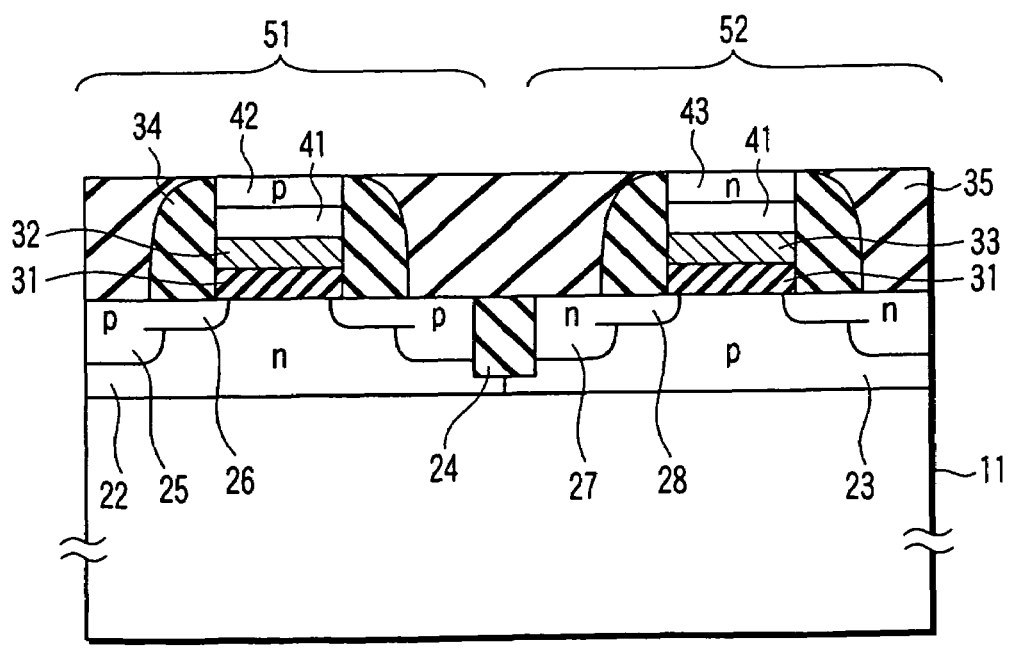
FIG. 13 is a sectional view showing a schematic structure of a semiconductor device according to a third embodiment.

A schematic configuration of a semiconductor device according to a third embodiment of the present invention is shown in FIG. 13, in which the same signs are assigned to the same parts as those in FIG. 1 and these parts are not described in detail.

A CMIS device of the present embodiment has a structure in which, in the structure of the first embodiment, there are, on a TaCx electrode for pMIS 32 in a p-channel MIS transistor 51, a silicon gate buffer TaCx layer 41 and a $p^+$ silicon gate electrode 42 thereon, and there are, on a TaCx electrode for nMIS 33 in an n-channel MIS transistor 52, a silicon gate buffer TaCx layer 41 and an $n^+$ silicon gate electrode 43.

In this structure, a silicon gate is disposed on the uppermost portion of the gate electrode to enhance process compatibility. A method of manufacturing the semiconductor device of the present embodiment will be described referring to FIGS. 14A to 14H.

Figure 14A:
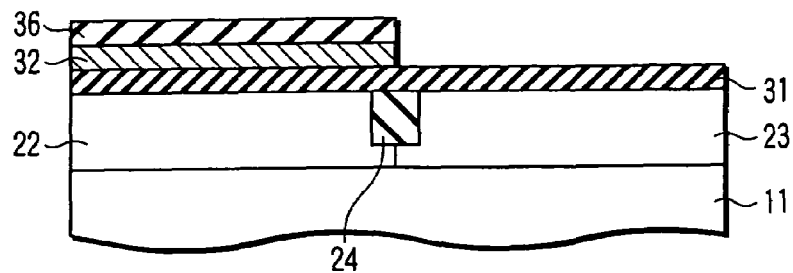
FIGS. 14A to 14H are sectional views showing step by step a process of manufacturing the semiconductor device according to the third embodiment.

First, as shown in FIG. 14A, an n-type well area 22 and a p-type well area 23 which are separated by an isolation insulator 24 are formed on an Si substrate 11. Subsequently, a gate dielectric material film 31, the TaCx electrode for pMIS 32 and an SiN layer 36 are consecutively deposited over the entire surface on a wafer. Then, the SiN layer 36 and the TaCx electrode for pMIS 32 on the top of the p-type well area 23 are removed by a conventional lithographic technique and etching technique, and a resist is then removed, thereby obtaining the structure in FIG. 14A.

Here, while any gate dielectric film may be used in the present embodiment, HfSiON having a thickness of 3 nm (Hf/Hf+Si≅0.5, nitrogen concentration: 20 atomic percent) is deposited in accordance with an MOCVD method by way of example. Methods of deposition that can be used include an ALD method, an MBE method, a PVD method and the like. Moreover, the TaCx electrode for pMIS 32 is formed at a thickness of 6 nm, and the SiN layer 36 is deposited at a thickness of 50 nm. The TaCx electrode for pMIS 32 needs to be larger than 5 nm for the reason described later.

Figure 14B:
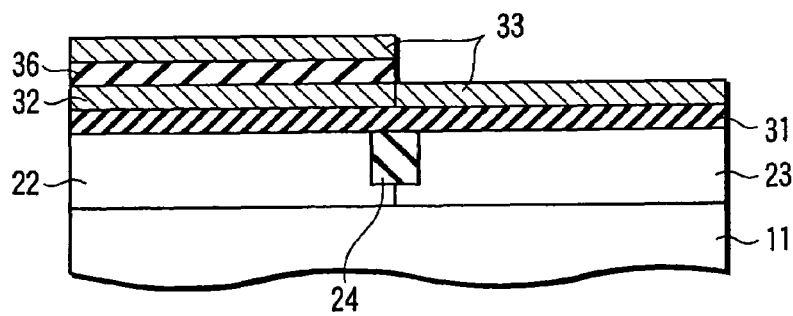
Figure 14C:
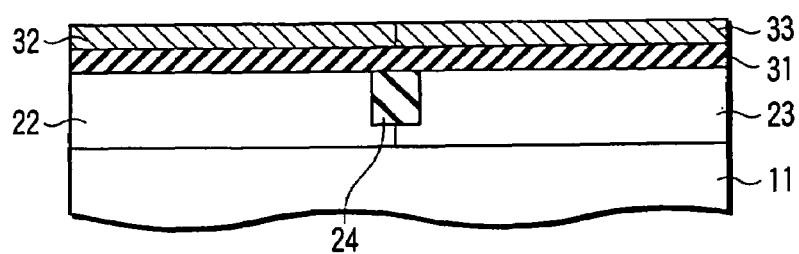

Next, as shown in FIG. 14B, the TaCx electrode for nMIS 33 is deposited over the entire surface on the wafer. Then, as shown in FIG. 14C, the SiN layer 36 is removed by a hot phosphoric acid treatment to remove the TaCx electrode for nMIS 33 covering the top of the SiN layer by lift off.

Figure 14D:
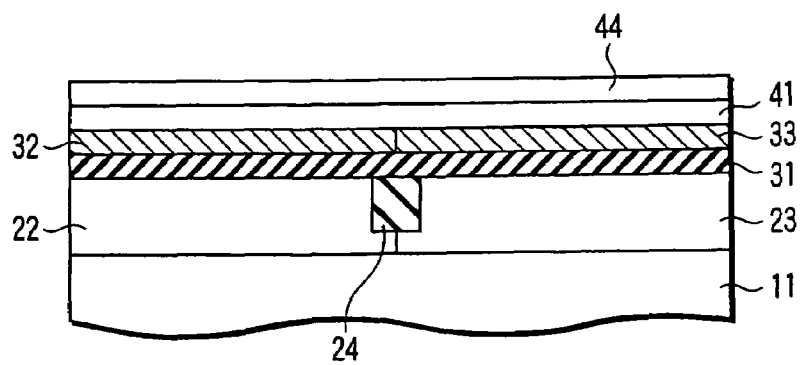

Next, as shown in FIG. 14D, the silicon gate buffer TaCx layer 41 and a non-doped silicon 44 are consecutively deposited over the entire surface on the wafer. The composition ratio (C/Ta) of the silicon gate buffer TaCx layer 41 is limited to 1.5 or more due to requirements described later. Moreover, the thickness thereof needs to be 5 nm or more for the reason described later. The silicon gate buffer TaCx layer 41 in the present embodiment has a C/Ta equal to 2.7 and a thickness of 10 nm. Here, Ge may be added to the non-doped silicon layer in a ratio of about 0.3 or less of Ge/Ge+Si, and the thickness thereof is 100 nm in the present embodiment.

Figure 14E:
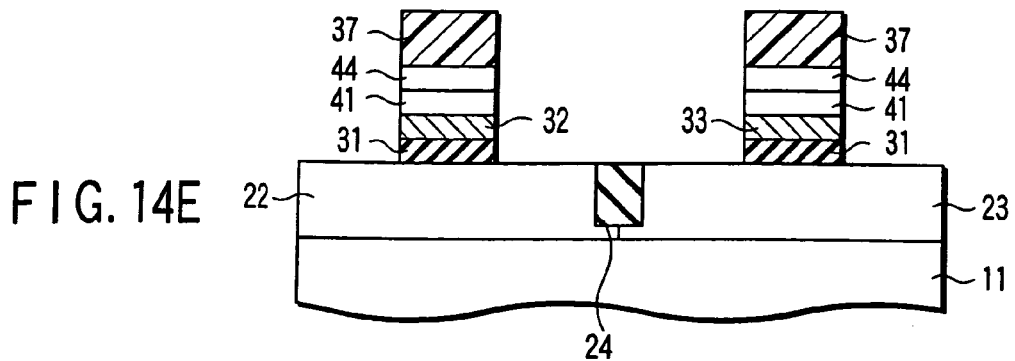

Next, as shown in FIG. 14E, a gate electrode resist pattern 37 is formed using a conventional lithographic technique and etching technique. Using this resist pattern 37 as a mask, the non-doped silicon 44, the silicon gate buffer TaCx layer 41, the TaCx electrode for pMIS 32, the TaCx electrode for nMIS 33 and the gate dielectric film 31 are collectively etched by an ordinarily used etching gas.

Figure 14F:
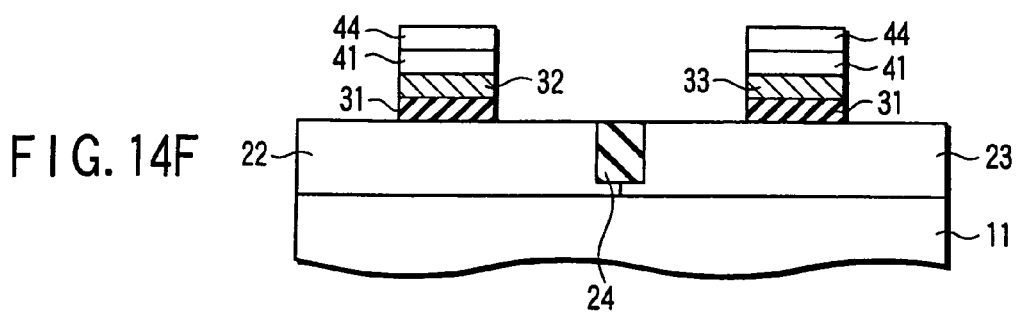

Next, as shown in FIG. 14F, the resist pattern 37 is removed by an $O_2$ asher treatment. At this point, the side surfaces of the silicon gate buffer TaCx layer 41, the TaCx electrode for pMIS 32 and the TaCx electrode for nMIS 33 are slightly oxidized. Subsequently, the resist, residuals and the like which have not been completely removed by the $O_2$ asher are chemically removed by a mixture of sulfuric acid and a hydrogen peroxide solution.

In contrast to the first and second embodiments, the top of the TaCx electrode is covered with the non-doped silicon 44 and the end face thereof is only slightly exposed in the present embodiment. The slightly exposed surface of the TaCx electrode is covered with a thin oxide. Thus, the gate-stacked structure in the present embodiment is more difficult to be eroded by the mixture of sulfuric acid and the hydrogen peroxide solution than the structures in the first and second embodiments, and has a greater margin of process conditions. For example, the structural resistance properties of the present embodiment are effective when a long-time treatment is carried out to more thoroughly remove the residuals.

Figure 14G:
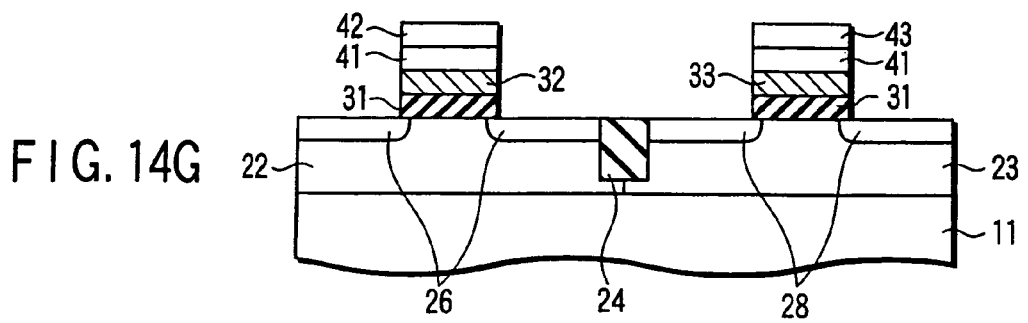
Figure 14H:
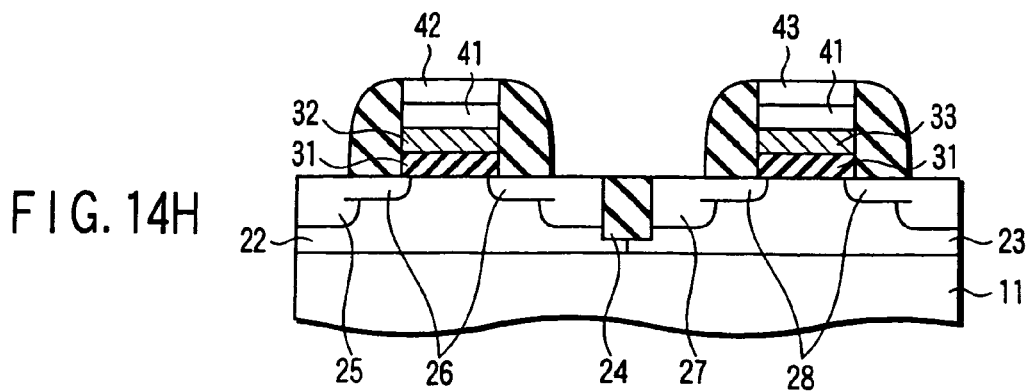

Next, as shown in FIG. 14G, an n-type extension layer 28 and a p-type extension layer 26 are formed in a process similar to those in the first and second embodiments. Further, in a process step similar to those in the first and second embodiments, a gate sidewall insulator 34 is formed, and n-type diffusion layer 27 and a p-type diffusion layer 25 are then formed, as shown in FIG. 14H. Subsequently, after the formation of an interlayer insulator 35 and conventional process steps such as planarization, the structure shown in FIG. 13 can be obtained. The silicon gate electrodes 42 and 43 may be silicided to reduce the resistance thereof.

According to the present embodiment, device characteristics similar to those in the first embodiment can be achieved with a significantly high process resistance by covering the TaCx layer with the silicon gate. It is to be noted that the buffering layer for the silicon gate is formed by totally the same constituting elements as those of the metal gate for controlling the work function such that an extremely highly stable gate stacked structure can be provided.

In prior arts, when a silicon gate is stacked on the top of the metal gate for controlling the work function, impurities for reducing the resistance of silicon diffuse into the metal gate, which causes disadvantages such as the modulation of the work function of the metal gate and a decrease in the impurity concentration of the silicon gate. On the contrary, such disadvantages are avoided if a metal gate having an amorphous structure such as TaSiN is used for the buffering layer for silicon.

However, there has heretofore been no material other than TaSiN as an amorphous metal material suitable for the buffer layer for the silicon gate which prevents the intrusion of impurities. On the other hand, the dual metal gate for controlling the work function is made of a material other than TaSiN. Mutual diffusion is easily caused by a thermal treatment in such a stacked structure having elements of different kinds. Thus, elements such as Ta, Si and N diffuse to the inside of the dual metal gate for controlling the work function, so that there has been a high possibility that the work function results in an unintended value.

In the present embodiment, a TaCx layer whose orientation is changed is used as the metal gate for controlling the work function, and a TaCx layer in which C/Ta is increased to 1.5 or more so that its structure becomes amorphous is used as the buffer layer for the silicon gate. Since the work function controlling metal gate and the buffer layer are made of the same elements, the disadvantages caused due to the use of the conventional elements of different kinds such as TaSiN are completely removed.

C/Ta of the TaCx electrode for pMIS 32 and the TaCx electrode for nMIS 33 in the present embodiment has to be 0.5 or more and 1.5 or less from FIGS. 4 to 6 as the limitation for these electrodes to be crystallized.

Furthermore, the thickness of the TaCx electrode for pMIS 32 and the TaCx electrode for nMIS 33 for controlling the work function in the present embodiment needs to be larger than 5 nm. The reason is that if the thickness is equal to or smaller than this, the work function of the silicon gate buffer TaCx layer 41 is active, so that a threshold voltage cannot be controlled by the work functions of the lower layer electrodes 32 and 33.

Furthermore, regarding the composition of the silicon gate buffer TaCx layer 41 in the present embodiment, this layer is amorphous or has a structure in which it is phase-separated into a matrix and precipitates sized at 5 nm or less, so that C/Ta needs to be 1.5 or more (see FIGS. 4 and 6). This makes it possible to efficiently suppress the diffusion of impurities from the silicon gate.

FIG. 15 is a sectional TEM image of a TaCx film in the case of (C/Ta)≅2.7. The TaCx film shows black and white contrast. Ta accumulates in black places, and white places are rich in carbon. The sizes of areas where Ta accumulates are 1 nm or less in this composition.

Figure 16:
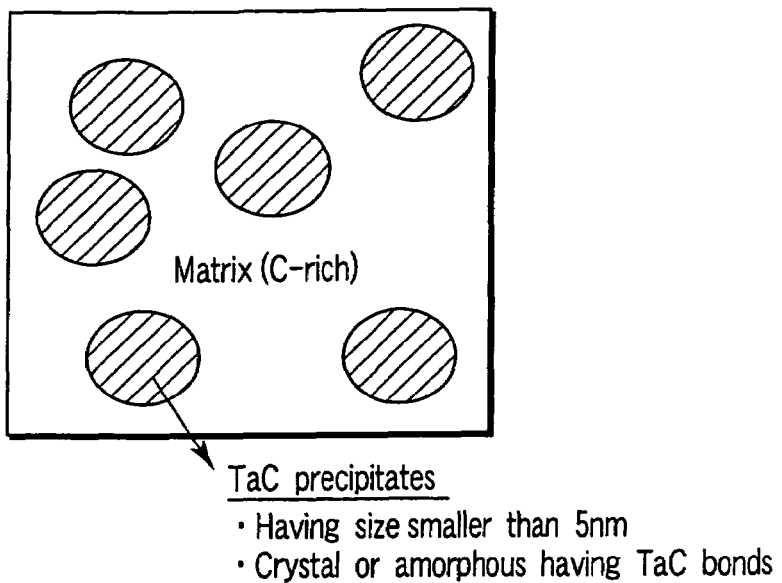
FIG. 16 is a schematic diagram for explaining the characteristics of a TaCx electrode.

FIG. 16 is a schematic diagram showing the characteristics of the TaCx gate electrode in the present embodiment. TaC precipitates having a diameter of 5 nm or less are formed in a C-rich TaCx (2<x) matrix. The Tac precipitates may be crystallized or in an amorphous state. The TaCx (2<x) matrix is in an amorphous state. The Tac precipitates are shown in black in the above-mentioned experiment results in FIG. 15.

Furthermore, the thickness of the silicon gate buffer TaCx layer 41 needs to be 5 nm or more. The reason is that the above-mentioned effect of suppressing the intrusion of impurities is not achieved if the TaCx electrode layer is smaller than this thickness.

Fourth Embodiment

Figure 17:
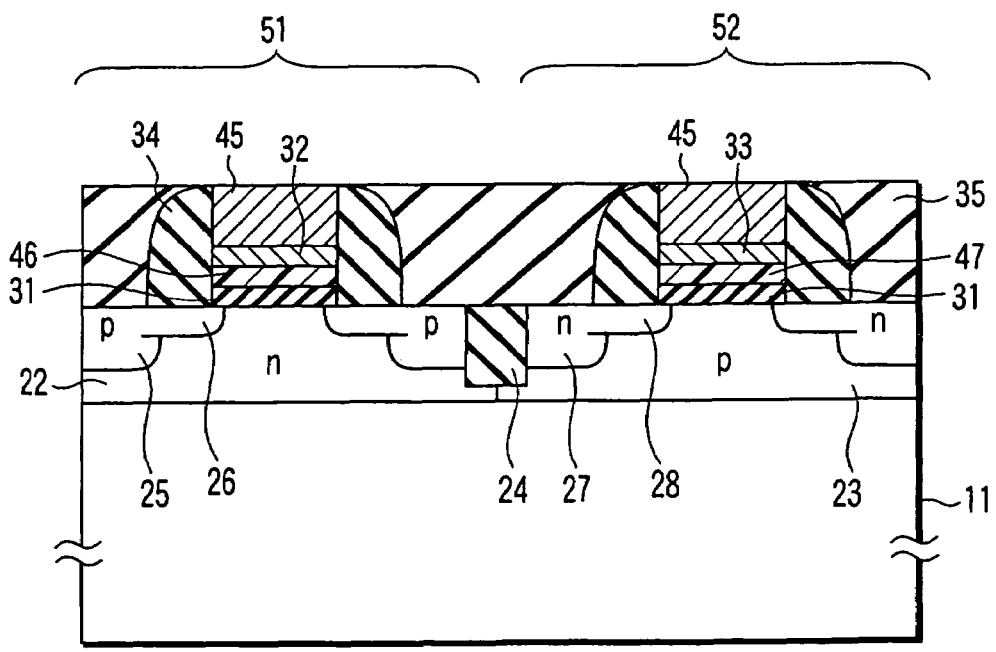
FIG. 17 is a sectional view showing a schematic structure of a semiconductor device according to a fourth embodiment.

A schematic configuration of a semiconductor device according to a fourth embodiment of the present invention is shown in FIG. 17, in which the same signs are assigned to the same parts as those in FIG. 1 and these parts are not described in detail.

A CMIS device of the present embodiment has a structure having: a gate stacked structure wherein a first element precipitated layer 46 is disposed on the top of a gate dielectric film 31 of a p-channel MIS transistor 51, on which a TaCx electrode for pMIS 32 and a metal silicide 45 are further stacked in this order; and a gate-stacked structure wherein a second element precipitated layer 47 is disposed on the top of a gate dielectric film 31 in an n-channel MIS transistor 52, on which a TaCx electrode for nMIS 33 and a metal silicide 45 are further stacked in this order.

In the structure of the present embodiment, the element precipitated layer is disposed at an interface with the gate dielectric film of the TaCx electrode for p(n)MIS of the p(n)-channel MIS transistor, such that the work function can be higher for pMIS and lower for nMIS than those described in the first to third embodiments, thereby making it possible to provide a high-performance CMIS device with a lower threshold voltage.

A method of manufacturing the semiconductor device of the present embodiment will be described referring to FIGS. 18A to 18I. First, process steps similar to those in the third embodiment are carried out to obtain the structure in FIG. 18A similar to that in FIG. 14C. Here, the TaCx electrode for pMIS 32 is formed on an n-type well area 22, and the TaCx electrode for nMIS 33 is formed on a p-type well area 23.

Next, a non-doped silicon 44 and an SiN film 36 are deposited in this order over the entire surface on a wafer in FIG. 18A, thus obtaining the structure in FIG. 18B. Both the non-doped silicon 44 and the SiN film 36 can be formed by an ordinarily used deposition technique such as CVD. Moreover, germanium up to about 30 atomic percent may be contained in the non-doped silicon 44.

Next, a gate electrode pattern is formed by a resist in accordance with a photolithographic technique used in conventional LIS process steps, and the SiN film 36 is processed into the shape of a gate electrode. Subsequently, using the SiN film 36 as a mask, the non-doped silicon 44, the TaCx electrode for pMIS 32, the TaCx electrode for nMIS 33 and the gate dielectric film 31 are collectively processed, thus obtaining the structure in FIG. 18C. This process can be carried out by a reactive ion etching using an etching gas containing chlorine.

Subsequently, an extension, gate sidewalls and a diffusion layer are formed as in the previous embodiment, and an interlayer insulator is deposited and planarized, thus obtaining the structure in FIG. 18D. Here, in the process of forming the extension and the diffusion layer, impurities are not introduced to the non-doped silicon 44 because its top is covered with SiN.

Figure 18D:
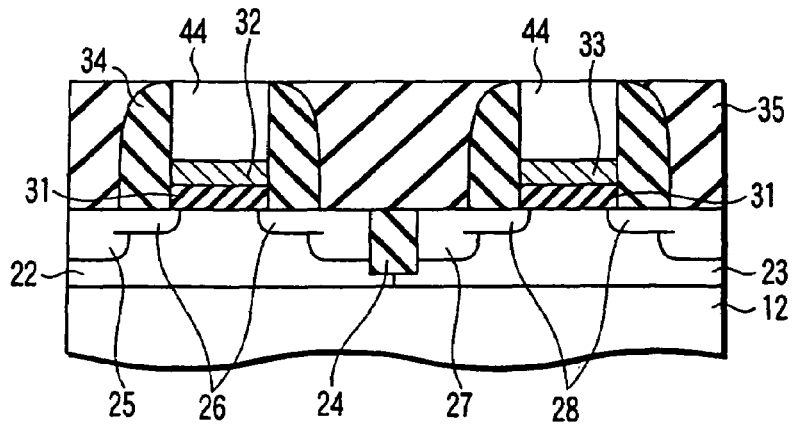
Figure 18E:
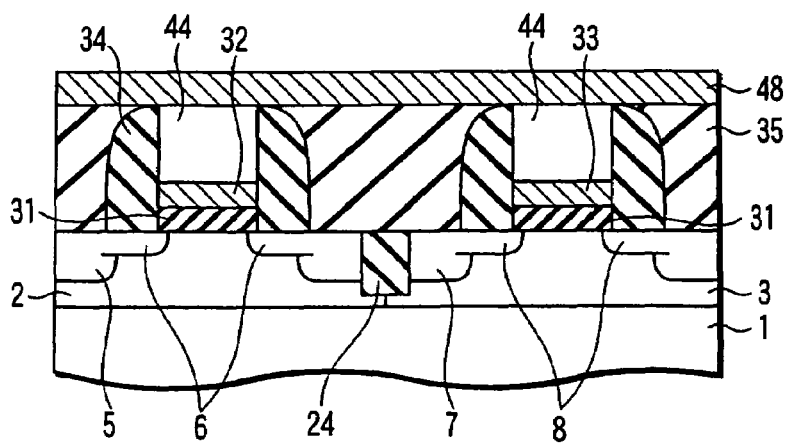
Figure 18F:
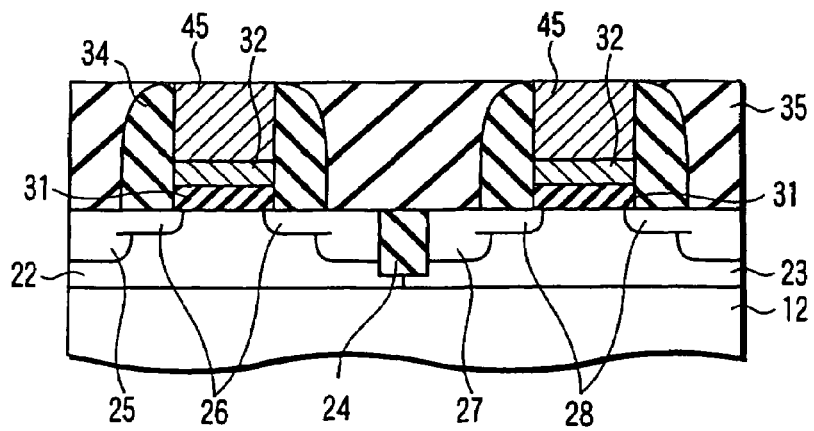

Next, as shown in FIG. 18E, a metal layer 48, here, Ni by way of example is deposited at 100 nm over the entire surface of the structure in FIG. 18D.

Then, the wafer is thermally treated at a relatively low temperature so that the metal layer 48 reacts with the non-doped silicon 44 in solid phase, and all the non-doped silicon is changed into the metal silicide 45. This thermal treatment can be carried out under conditions including a temperature ranging from 350 to 600° C., a time of about 60 seconds, and a nitrogen atmosphere. The time of the thermal treatment can be suitably changed, and an inert gas such as argon or hydrogen may be used in the thermal treatment atmosphere. Under such experimental conditions, the NiSi (monosilicide) layer 45 is formed when Ni is used. The unreacted Ni layer 44 remains on the top of the NiSi layer 45, and this can be immersed in a mixed solution of sulfuric acid and a hydrogen peroxide solution so that the Ni layer 44 alone is dissolved and the NiSi layer 45 remains on the wafer. Thus, the structure in FIG. 18F can be obtained.

When Ge is contained in the non-doped silicon, metal germano-silicide, NiSiGe in the present embodiment, is formed by totally the same process steps as the process described above. Unreacted Ni can be selectively etched in the same manner as NiSi.

Figure 18G:
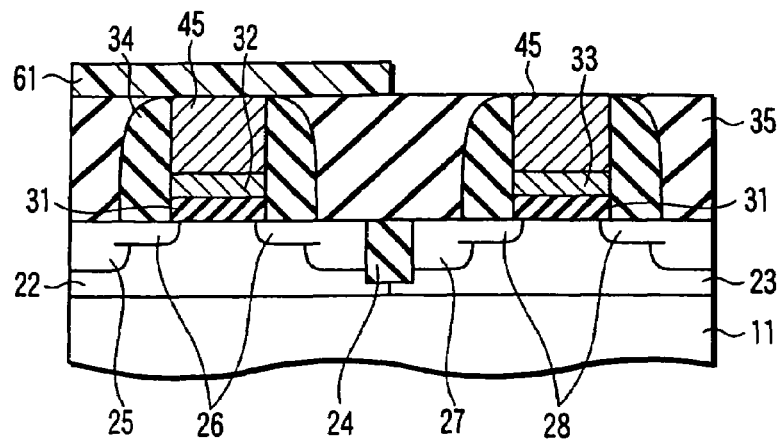

Next, as shown in FIG. 18G, the top of the p-channel MIS transistor area is covered with a mask member 61 so that the n-channel MIS transistor area is opened, and impurities are ion-implanted into the NiSi layer 45 of the n-channel MIS transistor area 52. In this case, the kinds of impurities used are phosphorus, arsenic and antimony, an implantation amount is about $10^{15}$ to $10^{16}/cm^2$, and acceleration energy is conditioned in accordance with the mass of the impurities so that the impurities remain within the NiSi layer 45.

Figure 18H:
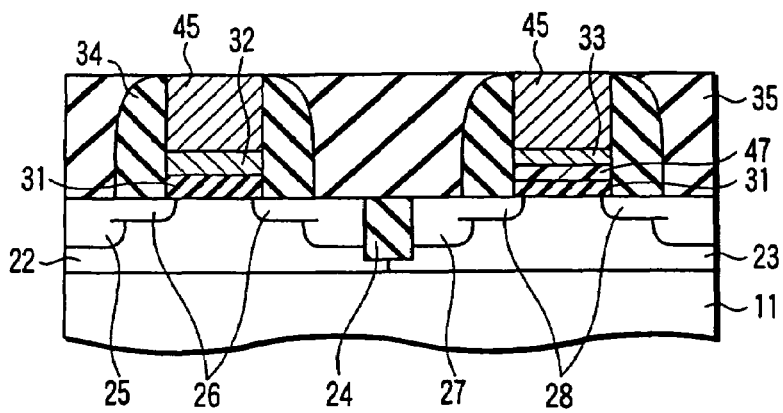

Furthermore, the structure in FIG. 18G is thermally treated to precipitate the implanted impurities such as phosphorus to an interface between the gate dielectric film 31 and the TaCx electrode for nMIS 33, and the second element precipitated layer 47 is formed, thus obtaining the structure in FIG. 18H. The thermal treatment can be carried out under conditions including a temperature between 400° C. and 600° C., a time of about 60 seconds, and an inert atmosphere containing nitrogen or the like.

Figure 18I:
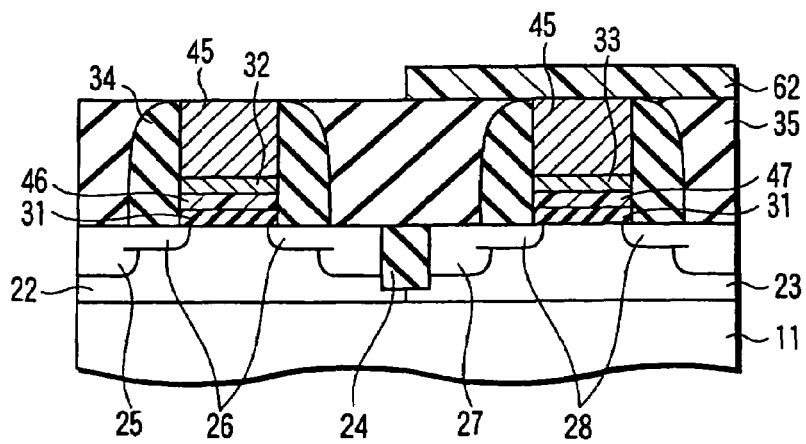

Next, as shown in FIG. 18I, the top of the n-channel MIS transistor area is covered with a mask member 62, and impurities are ion-implanted into the NiSi layer 45 of the p-channel MIS transistor area. In this case, the kinds of impurities used are, for example, boron (B), $BF_2$ and aluminum (Al), an implantation amount is about $10^{15}$ to $10^{16}$ $cm^{-2}$, and acceleration energy is conditioned in accordance with the mass of the impurities so that the impurities remain within the NiSi layer 45.

Subsequently, a thermal treatment is carried out, and the implanted impurities such as boron is precipitated to an interface area between the gate dielectric film 31 and the TaCx electrode for pMIS 32, and then the first element precipitated layer 46 is formed. The thermal treatment can be carried out under conditions including a temperature between 400° C. and 600° C., a time of about 60 seconds, and an inert atmosphere with nitrogen or the like. Then, the mask member 62 is removed, such that the structure in FIG. 17 is achieved. The thickness of the first element precipitated layer 46 corresponds to one or more atomic layers and five or less atomic layers. One atomic layer makes it possible to obtain a change of the work function sufficiently stable for controlling the threshold voltage, but with a thickness smaller than this, it is difficult to obtain a work function change due to the modulation of the impurities as shown in FIG. 19. With a thickness corresponding to five or more atomic layers, the work function possessed by the precipitated impurities starts to be active. In this case, a work function is shown which is totally different from the work function owing to the TaCx orientation and the modulation by the impurity precipitation that are added together as shown in FIG. 19, so that the advantage of the present invention can not be obtained.

It is more desirable that the thickness of the impurity precipitated layer correspond to one or more atomic layers and three or less atomic layers. In principle, the advantage of the present invention can be obtained if the impurity precipitated layer has one atomic layer, but a reliable advantage can be expected when a somewhat thick impurity precipitated layer is formed to allow for a margin of error, considering, for example, the possibility that the impurities diffuse to places other than the interface and the possibility that the impurity precipitated layer is spatially nonuniformly formed. The advantage of the present invention can be obtained up to five atomic layers, but the limit of thickness is optimally about three atomic layers.

This is concerned with the fact that the impurities are added by the ion implantation after the formation of the electrode in the present invention. Typically, three atomic layers can be achieved by $1 \times 10^{16}/cm^2$, but $2 \times 10^{16}/cm^2$ is required to create four atomic layers. Ions implanted to create four atomic layers are functionally wasteful. On the other hand, ion implantation with a high current and a long time is required for the ion implantation on the level of $10^{16}/cm^2$, and on this order, it is required in terms of cost to reduce the implantation amount as much as possible. As described above, the limitation of three or less atomic layers is decided by problems of manufacturing cost.

Here, the process has been described in which the first element precipitated layer 46 and the second element precipitated layer 47 are formed in separate thermal treatments. However, it is also possible to form both the element precipitated layers in the same thermal treatment. This is possible when impurity elements having about the same diffusion coefficient in the metal silicide/TaCx stacked gate electrode are used. For example, this process can be achieved when a combination of impurity elements such as phosphorus for the n-channel MIS transistor and boron for the p-channel MIS transistor is used. This simplifies the manufacturing process.

The present embodiment employs slightly complicated processing steps: after the metal silicide/TaCx electrode stacked gate electrode is formed, elements are implanted into the metal silicide, which are thermally diffusion and precipitated to the interface between the gate dielectric film and the TaCx electrode. In the present embodiment, both the metal silicide and TaCx have polycrystalline structures, and their crystal grain boundaries function as high-speed diffusion channels for the impurity diffusion. Therefore, the impurity elements introduced into the metal silicide relatively easily diffuse within the electrode, and are precipitated to the interface with the gate dielectric film. Since the diffusion within the metal gate occurs at a high speed at a low temperature of 600° C. or less, there is no fear that the impurities infiltrate into the gate dielectric film 31 due to this diffusion process to deteriorate device characteristics.

FIG. 19 is a diagram for explaining the advantage of the present embodiment. In the first to third embodiments, nearly ideal work functions are achieved by controlling the orientation of the TaCx electrode, but a work function of about 4 eV is required for the n-channel MIS transistor 52 and a work function of about 5 eV is required for the p-channel MIS transistor 51 in order to further decrease the threshold voltage of the transistor. In the present embodiment, the control of the work function achieved by the control of the orientation of TaCx is combined with the effects of modulation of the work function due to the element precipitation, thereby making it possible to achieve the ideal work functions. Thus, it is possible to achieve a CMIS device with an almost ideal low threshold voltage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a substrate; and
an n-channel MIS transistor formed on the substrate, having a gate dielectric film formed on the substrate, and a gate electrode formed on the gate dielectric film, the gate electrode formed of a Ta—C alloy in which a crystal orientation ratio of a TaC (111) face in a film thickness direction of the gate electrode [TaC (111) face/{TaC (111) face+TaC (200) face}] is 60% or less.

2. The device according to claim 1, wherein a composition ratio (C/Ta) of the gate electrode is 0.5 or more and 1.5 or less.

3. A semiconductor device comprising:
a substrate; and
an n-channel MIS transistor formed on a p-type semiconductor area, having a gate dielectric film formed on the p-type semiconductor area, and a gate electrode formed on the gate dielectric film, the gate electrode including a lower layer gate electrode formed of a Ta—C alloy in which a crystal orientation ratio of a TaC (111) face in a film thickness direction of the lower layer gate electrode [TaC (111) face/{TaC (111) face+TaC (200) face}] is 60% or less, a middle layer gate electrode formed on the lower layer gate electrode and formed of a Ta—C alloy in which the composition ratio (C/Ta) is 1.5 or more, and an upper layer gate electrode formed on the middle layer gate electrode and formed of $n^+$-type silicon or $n^+$-type silicon germanium.

4. The device according to claim 3, wherein a composition ratio (C/Ta) of the lower layer gate electrode is 0.5 or more and 1.5 or less.

5. The device according to claim 3, wherein a thickness of the lower layer gate electrode is larger than 5 nm.

6. The device according to claim 3, wherein the middle layer gate electrode is phase-separated into amorphous matrices and TaC precipitates.

7. The device according to claim 3, wherein the middle layer gate electrode is amorphous.

8. A semiconductor device comprising:
a substrate;
an n-channel MIS transistor formed on a p-type semiconductor area, including a gate dielectric film formed on the p-type semiconductor area, a lower layer gate electrode formed on the gate dielectric film and formed of a Ta—C alloy in which a crystal orientation ratio of a TaC (111) face in its film thickness direction of the lower layer gate electrode [TaC (111) face/{TaC (111) face+TaC (200) face}] is 60% or less, an upper layer gate electrode formed on the lower layer gate electrode and made of a metal silicide, and an element precipitated layer formed in an interface area between the lower layer gate electrode and the gate dielectric film, the element being selected from the group consisting of phosphorus, arsenic and antimony.

9. The device according to claim 8, wherein the metal silicide contains at least one selected from the group consisting of Ni, Co, Pt and Ir.

10. The device according to claim 9, wherein the metal silicide further contains germanium.

11. The device according to claim 8, wherein the element precipitated layer has three atomic layers or less.

* * * * *